(12) United States Patent
Kim et al.

(10) Patent No.: US 8,927,302 B2
(45) Date of Patent: Jan. 6, 2015

(54) CHEMICAL VAPOR DEPOSITION APPARATUS AND METHOD FOR MANUFACTURING LIGHT-EMITTING DEVICES USING SAME

(75) Inventors: Jun Woo Kim, Gunpo-si (KR); Takeya Motonobu, Suwon-si (KR); In Hoe Hur, Anyang-si (KR); Choo Ho Kim, Yongin-si (KR); Jae Bong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/824,349

(22) PCT Filed: Dec. 20, 2011

(86) PCT No.: PCT/KR2011/009853
§ 371 (c)(1),
(2), (4) Date: May 29, 2013

(87) PCT Pub. No.: WO2012/087002
PCT Pub. Date: Jun. 28, 2012

(65) Prior Publication Data
US 2013/0260488 A1    Oct. 3, 2013

(30) Foreign Application Priority Data

Dec. 20, 2010  (KR) .................. 10-2010-0130779
Dec. 20, 2010  (KR) .................. 10-2010-0130780
Dec. 20, 2011  (KR) .................. 10-2011-0137881

(51) Int. Cl.
*H01L 21/00*      (2006.01)
*C23C 16/455*    (2006.01)
*H01L 33/48*      (2010.01)
(Continued)

(52) U.S. Cl.
CPC .......... *C23C 16/45502* (2013.01); *H01L 33/48* (2013.01); *C23C 16/303* (2013.01); *C30B*
(Continued)

(58) Field of Classification Search
CPC ............ C23C 16/455; C23C 16/45502; C23C 16/45512; C23C 16/45519; C23C 16/45563; C23C 16/45578
USPC .................................................. 118/715, 728
See application file for complete search history.

(56) References Cited

U.S. PATENT DOCUMENTS 7,294,207 B2 * 11/2007 Strauch et al. ................ 118/715
8,430,960 B2 *  4/2013 Sumakeris et al. ........... 118/715
(Continued)

FOREIGN PATENT DOCUMENTS

JP         2003-158081 A         5/2003
(Continued)

OTHER PUBLICATIONS

International Preliminary Report on Patentability and Written Opinion of the International Searching Authority, w/ English translation thereof, issued in International Application No. PCT/KR2011/009853 dated Jul. 4, 2013.

(Continued)

*Primary Examiner* — Reema Patel
*Assistant Examiner* — Syed Gheyas
(74) *Attorney, Agent, or Firm* — McDermott Will & Emery LLP

(57) ABSTRACT

Provided are a CVD apparatus and a method of manufacturing a light emitting device using the same. The CVD apparatus includes a chamber body including a susceptor having at least one pocket part having a wafer stably mounted therein; a chamber cover provided with the chamber body to open or close the chamber body and having a reaction space between the susceptor and the chamber cover; a reactive gas supplier supplying the reactive gas into the reaction space to allow the reactive gas to flow across a surface of the susceptor; and a non-reactive gas supplier supplying a non-reactive gas into the reaction space to allow the non-reactive gas to flow across a surface of the chamber cover between the susceptor and the chamber cover so as to prevent the reactive gas from contacting the surface of the chamber cover.

16 Claims, 19 Drawing Sheets

(51) Int. Cl.
  *C23C 16/30* (2006.01)
  *C30B 25/14* (2006.01)
  *C23C 16/44* (2006.01)
  *C23C 16/458* (2006.01)
  *C30B 25/12* (2006.01)
  *C30B 29/40* (2006.01)
  *H01L 33/00* (2010.01)

(52) U.S. Cl.
  CPC ..... 25/14 (2013.01); *C23C 16/4401* (2013.01); *C23C 16/45519* (2013.01); *C23C 16/4584* (2013.01); *C30B 25/12* (2013.01); *C30B 29/406* (2013.01); *H01L 33/007* (2013.01)
  USPC ............................................ 438/26; 118/728

(56) References Cited

U.S. PATENT DOCUMENTS

| | | |
|---|---|---|
| 2001/0029892 A1 | 10/2001 | Cook et al. |
| 2002/0129769 A1 | 9/2002 | Kim et al. |
| 2007/0101939 A1* | 5/2007 | Sumakeris et al. ........... 118/724 |
| 2009/0155941 A1 | 6/2009 | Konuma et al. |
| 2009/0178616 A1 | 7/2009 | Byun |
| 2009/0266911 A1* | 10/2009 | Kim et al. ................ 239/265.11 |
| 2009/0288604 A1 | 11/2009 | Kim et al. |
| 2010/0307416 A1 | 12/2010 | Park et al. |

FOREIGN PATENT DOCUMENTS

| | | | |
|---|---|---|---|
| KR | 2007098104 A | * | 10/2007 |
| KR | 20070098104 A | | 10/2007 |
| KR | 20100083041 A | | 7/2010 |
| KR | 20100089058 A | | 8/2010 |

OTHER PUBLICATIONS

Office Action dated Jan. 16, 2014 issued in the corresponding Taiwanese application No. 100147325.

* cited by examiner

CHEMICAL VAPOR DEPOSITION APPARATUS AND METHOD FOR MANUFACTURING LIGHT-EMITTING DEVICES USING SAME

This application is a 371 of international application PCT/KR2011/009853 filed Dec. 20, 20111, which claims priority based on Korean Patent Application Nos. 10-2010-0130779 filed Dec. 20, 2010; 10-2010-0130780 filed Dec. 20, 2010 and 10-2011-0137881 filed Dec. 20, 2011,the entire contents of each of which are hereby incorporated by reference.

TECHNICAL FIELD

The present invention relates to a chemical vapor deposition apparatus and a method of manufacturing a light emitting device using the same.

BACKGROUND ART

Recently, the requirement for the development of a miniaturized semiconductor device and a highly efficient, high output light emitting device (LED), or the like, has highlighted the necessity of allowing for the mass production of chemical vapor deposition (CVD) equipment without degradation in the quality or performance thereof in various industrial fields.

In general, CVD is applied to grow an epitaxial thin film on a top surface of a heated wafer through a chemical reaction of a reactive gas introduced into a reaction chamber.

However, this reactive gas not only undergoes a chemical reaction on the surface of a wafer to be deposited, but also on an inner upper surface of a reaction chamber as a dummy coating due to a parasitic deposition. A deposited material such as a dummy coating or the like may cause a change in a process or may be thicker and finally detached to become particles during the process. This is a factor in a low production yield. In order to eliminate this factor, a deposited material such as a dummy coating should be periodically eliminated, but a series of operations for eliminating the deposited material may bring about a reduction in productivity.

DISCLOSURE

Technical Problem

An aspect An aspect of the present invention provides a chemical vapor deposition (CVD) apparatus capable of preventing a deposition material from being deposited in an unnecessary position, for example, on the ceiling provided as an inner upper surface of a reaction chamber, and a method of manufacturing a light emitting device using the same.

Another aspect of the present invention provides a chemical vapor deposition (CVD) apparatus capable of improving crystallization in an epitaxial thin film growth process by significantly reducing the generation of heat convection in a reactive gas within a reaction chamber, and a method of manufacturing a light emitting device using the same.

Technical Solution

According to an aspect of the present invention, there is provided a CVD apparatus including: a chamber body including a susceptor having at least one pocket part formed therein, the pocket part having a wafer stably mounted therein; a chamber cover provided with the chamber body to open or close the chamber body and forming a reaction space between the susceptor and the chamber cover; a reactive gas supplier supplying the reactive gas to the reaction space to allow the reactive gas to flow across a surface of the susceptor; and a non-reactive gas supplier supplying a non-reactive gas to the reaction space to allow the non-reactive gas to flow across a surface of the chamber cover between the susceptor and the chamber cover so as to prevent the reactive gas from contacting the surface of the chamber cover.

The non-reactive gas supplier may include a non-reactive gas introduction passage provided with the chamber cover to introduce the non-reactive gas from the outside, and non-reactive gas nozzles releasing the introduced non-reactive gas into the reaction space.

A plurality of the non-reactive gas nozzles may be distributedly disposed on a lower surface of the chamber cover exposed to the reaction space.

The chamber cover may include a cover member facing the susceptor in a lower part thereof and exposed to the reaction space.

The cover member may be detachable from the chamber cover.

The plurality of non-reactive gas nozzles may be distributedly disposed on the cover member exposed to the reaction chamber.

The non-reactive gas introduction passage may be extended to the susceptor while penetrating the cover member and the non-reactive gas nozzles may be formed along a circumferential surface of the non-reactive gas introduction passage exposed to an inner portion of the reaction space to radially release the non-reactive gas.

The non-reactive gas supplier may further include a connection part connecting the non-reactive gas introduction passage with the non-reactive gas nozzles.

The connection part may have a lower end positioned in a location between 5% to 50% of a distance between the susceptor and the cover member forming the reaction space toward the susceptor based on the cover member.

The connection parts may be disposed to be spaced apart from each other vertically within a multi-layered structure provided in a lengthwise direction of the non-reactive gas introduction passage.

The connection part may include a plurality of plate members disposed to be spaced apart from each other vertically within the multi-layered structure provided in the lengthwise direction of the non-reactive gas introduction passage in the reaction space.

The plurality of plate members may be disposed concentrically to have a plurality of concentric circles having different radii based on the center of the non-reactive gas introduction passage, and may have a structure in which the sizes of radii thereof are reduced from an upper part toward a lower part.

The plurality of plate members may be insertedly fixed to the non-reactive gas introduction passage or integrated with the carrier base introduction passage.

The non-reactive gas nozzles may be tilted in a flow direction of the reactive gas so as to correspond to the flow direction of the reactive gas supplied through the reactive gas supplier.

The non-reactive gas supplier may radially or reverse radially release the non-reactive gas into the reaction space through the non-reactive gas nozzles.

The non-reactive gas supplier may further include a non-reactive gas storage chamber provided in the chamber cover.

The non-reactive gas nozzles may communicate with the non-reactive gas storage chamber through the non-reactive gas introduction passage, and may release the non-reactive gas received in the non-reactive gas storage chamber to the reaction space.

The non-reactive gas nozzles may have a circular or slit structure.

The plurality of non-reactive gas nozzles may be disposed concentrically such that they are spaced apart from each other along the plurality of concentric circles having different sizes based on the center of the chamber cover, the non-reactive gas nozzles provided along a circumference of each concentric circle being formed to have an arc shape of a corresponding concentric circle.

The non-reactive gas nozzles may be disposed such that the plurality of non-reactive gas nozzles provided along the circumference of each concentric circle are alternated with other plurality of non-reactive gas nozzles provided along circumferences of concentric circles adjacent thereto.

A distance between the non-reactive gas nozzles provided with respective odd-numbered concentric circles from the center of the chamber cover, and a distance between the non-reactive gas nozzles provided with respective even-numbered concentric circles, may be equal to each other.

The non-reactive gas nozzles may be bent from the non-reactive gas introduction passage in the flow direction of the reactive gas.

The chamber cover may include a plurality of step parts formed concentrically and radially with regard to the center of the chamber cover, in a lower surface thereof exposed to the reaction chamber.

The step parts may each include a vertical surface to which the non-reactive gas nozzles are exposed to release the non-reactive gas to the reaction chamber, and an inclined surface tilted downwardly toward a vertical surface of another step part adjacent in the flow direction of the reactive gas.

The step parts may each include the vertical surface to which the non-reactive gas nozzles are exposed to release the non-reactive gas to the reaction chamber, and a plane extended to a vertical surface of another step part adjacent in the flow direction of the reactive gas.

The reactive gas supplier may include at least one reactive gas storage chamber provided along a circumferential edge of the chamber body to store the reactive gas introduced from the outside, and a reactive gas nozzles communicating with the reactive gas storage chamber and the reaction space to release the reactive gas stored in the reactive gas storage chamber to the reaction space.

The reactive gas supplier may further include at least one partition part formed in the reactive gas storage chamber to divide the reactive gas storage chamber into a plurality of regions.

The reactive gas supplier may include at least one reactive gas introduction passage provided in a central axis of the susceptor to introduce the reactive gas from the outside, and reactive gas nozzles releasing the reactive gas introduced through the reactive gas introduction passage to the reaction space so as to form a radial type gas flow from the center of the susceptor to an outer circumference thereof.

The reactive gas supplier may include a reactive gas introduction passage extended to the susceptor while penetrating the chamber cover to introduce the reactive gas from the outside, and reactive gas nozzles formed along a circumferential surface of the reactive gas introduction passage to release the reactive gas into the reaction space so as to form a radial type gas flow from the center of the chamber cover to an outer circumference thereof.

The non-reactive gas supplier may include a non-reactive gas introduction passage formed to penetrate the chamber cover and having the reactive gas introduction passage received therein, to introduce the non-reactive gas through a space between the reactive gas introduction passage and the non-reactive gas introduction passage; and non-reactive gas nozzles formed along a circumferential surface of the non-reactive gas introduction passage to radially release the non-reactive gas into the reaction space, the non-reactive gas nozzles being disposed between the chamber cover and the reactive gas nozzles.

The reactive gas introduction passage may be extended toward the susceptor to be longer than the non-reactive gas introduction passage, and the reactive gas nozzles may be exposed toward the reaction space in a lower end of the non-reactive gas introduction passage.

The plurality of non-reactive gas nozzles may be disposed along a circumferential surface of the non-reactive gas introduction passage, the plurality of reactive gas nozzles being disposed along a circumferential surface of the reactive gas introduction passage, such that the non-reactive gas nozzles and the reactive gas nozzles are provided to be side by side or alternated with one another in a zigzag manner.

The CVD apparatus may further include a refrigerant storage chamber provided in the chamber cover.

According to another aspect of the present invention, there is provided a method of manufacturing a light emitting device, including: mounting a wafer for thin film growth process in a pocket part formed on a susceptor provided in a chamber body, and covering the chamber body with a chamber cover so as to be maintained as a sealing state thereof; releasing a non-reactive gas introduced from the outside through a non-reactive gas supplier disposed in the chamber cover, into a reaction space formed between the chamber cover and the susceptor; releasing a reactive gas into the reaction space through a reactive gas supplier disposed within the chamber body to grow a thin film on a surface of the wafer; and replacing the wafer completed in the thin film growth process with a new wafer by opening the chamber cover covering the chamber body.

The releasing of the non-reactive gas may be performed prior to or simultaneously to releasing the reactive gas.

The releasing of the reactive gas may include supplying the reactive gas into the reaction space to allow the reactive gas to flow across the surface of the susceptor, and the releasing of the non-reactive gas may include supplying the non-reactive gas into the reaction space to allow the non-reactive gas to flow across a surface of the chamber cover so as to prevent the reactive gas from contacting the surface of the chamber cover.

The releasing of the non-reactive gas may include supplying the non-reactive gas to follow a flow of the reactive gas so as to correspond to a flow direction of the reactive gas supplied through the reactive gas supplier.

Advantageous Effects

According to an embodiment of the present invention, a deposition material may be suppressed from being deposited on a ceiling part of a reaction chamber during a thin film growth process on a wafer, such that a reactive gas has a stable flow without being affected by any interference, thereby achieving a thin film growth with a prominent quality.

In addition, the attachment of a deposition material such as a dummy coating may be suppressed, whereby a regular maintenance period for a deposition removal or the like may be elongated due to an attachment suppression of deposition material such as a dummy coating, thereby improving the productivity.

Moreover, a generation of foreign substances such as particles may be reduced, thereby increasing a production yield and improving process reproducibility and a quality.

DESCRIPTION OF DRAWINGS

The above and other aspects, features and other advantages of the present invention will be more clearly understood from the following detailed description taken in conjunction with the accompanying drawings, in which.

MODE FOR INVENTION

Figure 1:
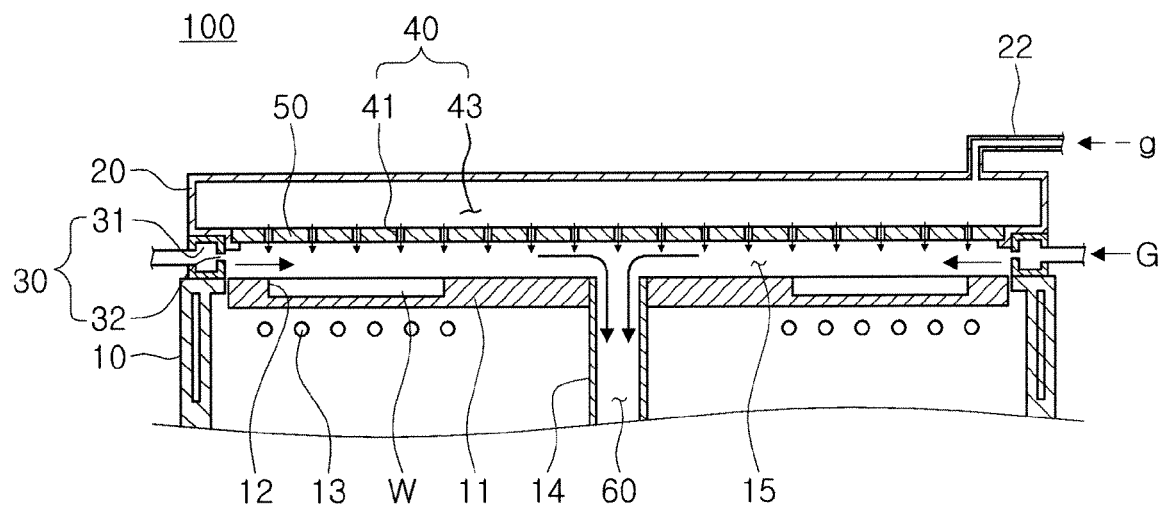
FIG. 1 is a cross-sectional view of a CVD apparatus according to an embodiment of the present invention.

Embodiments of the present invention will now be described in detail with reference to the accompanying drawings such that they could be easily practiced by those having ordinary skill in the art to which the present invention pertains. However, in describing the embodiments of the present invention, detailed descriptions of well-known functions or constructions will be omitted so as not to obscure the gist of the present invention with unnecessary detail.

In the drawings, the shapes and dimensions may be exaggerated for clarity, and the same reference numerals will be used throughout to designate the same or like components.

According to an embodiment of the present invention, a chemical vapor deposition (CVD) apparatus will be described with reference to FIGS. 1 to 10.

Figure 2:
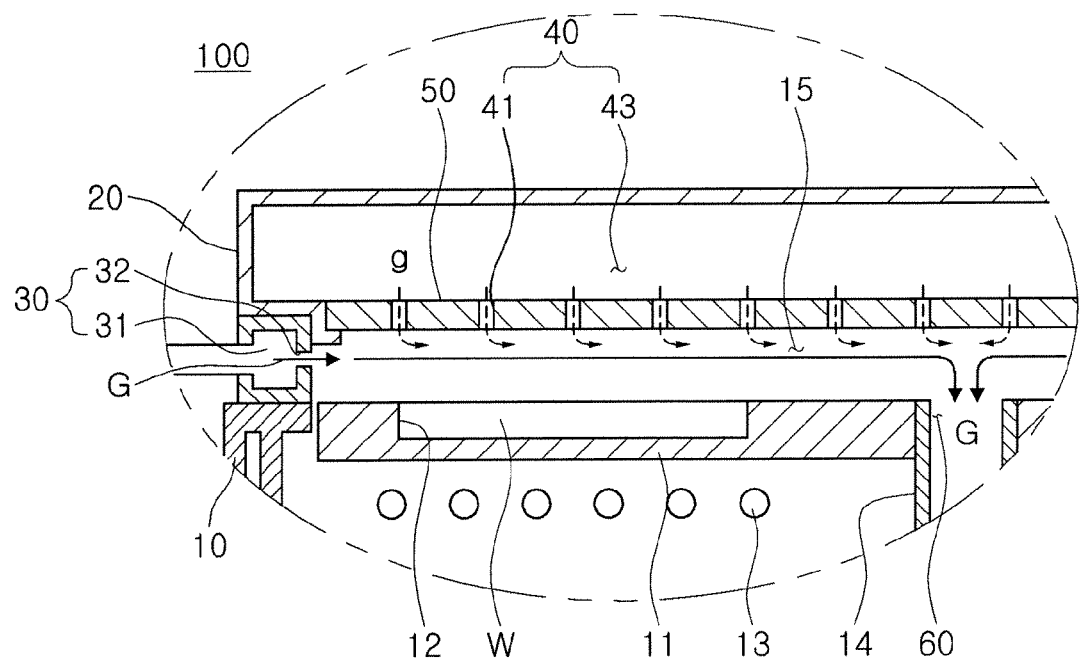
FIG. 2 is a cross-sectional view illustrating a gas flow through a reactive gas supplier and a non-reactive gas supplier shown in FIG. 1.
Figure 3:
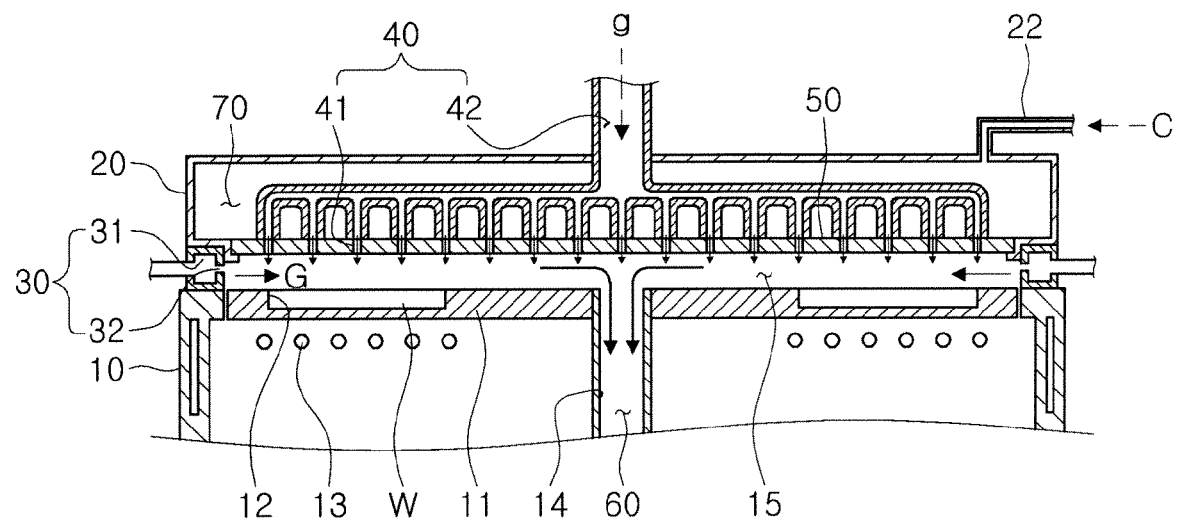
FIG. 3 is a cross-sectional view of a non-reactive gas supplier according to another embodiment of the present invention.
Figure 4:
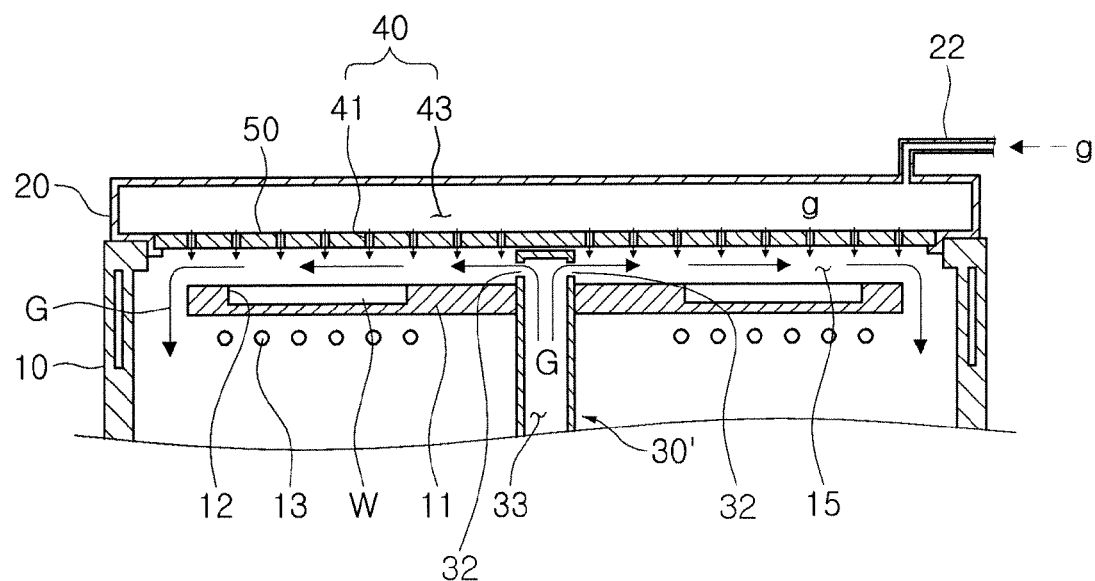
FIGS. 4 and 5 are cross-sectional views of a reactive gas supplier according to another embodiment of the present invention.
Figure 5:
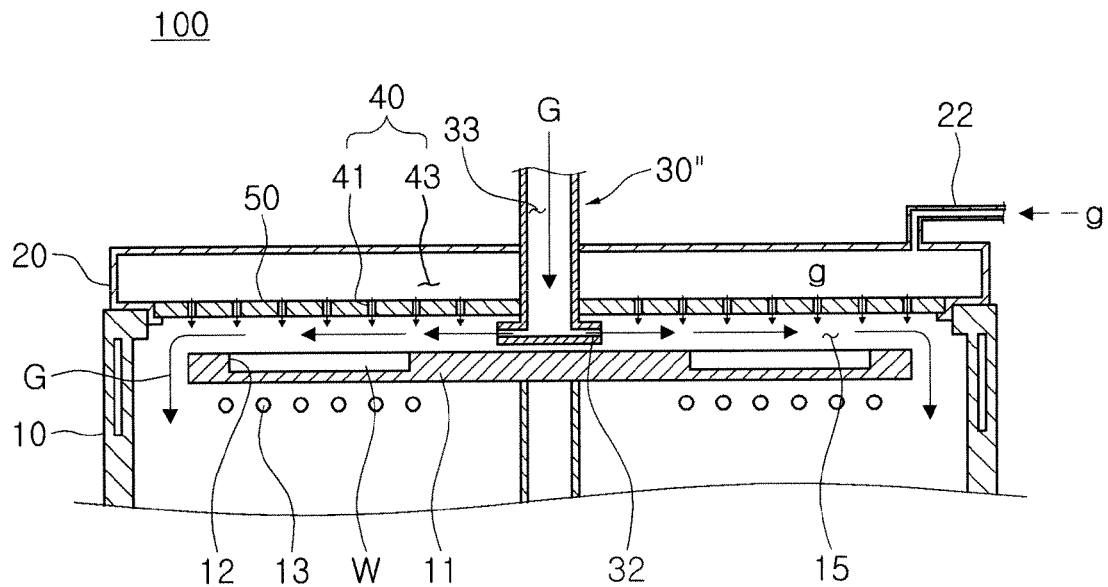
Figure 6A:
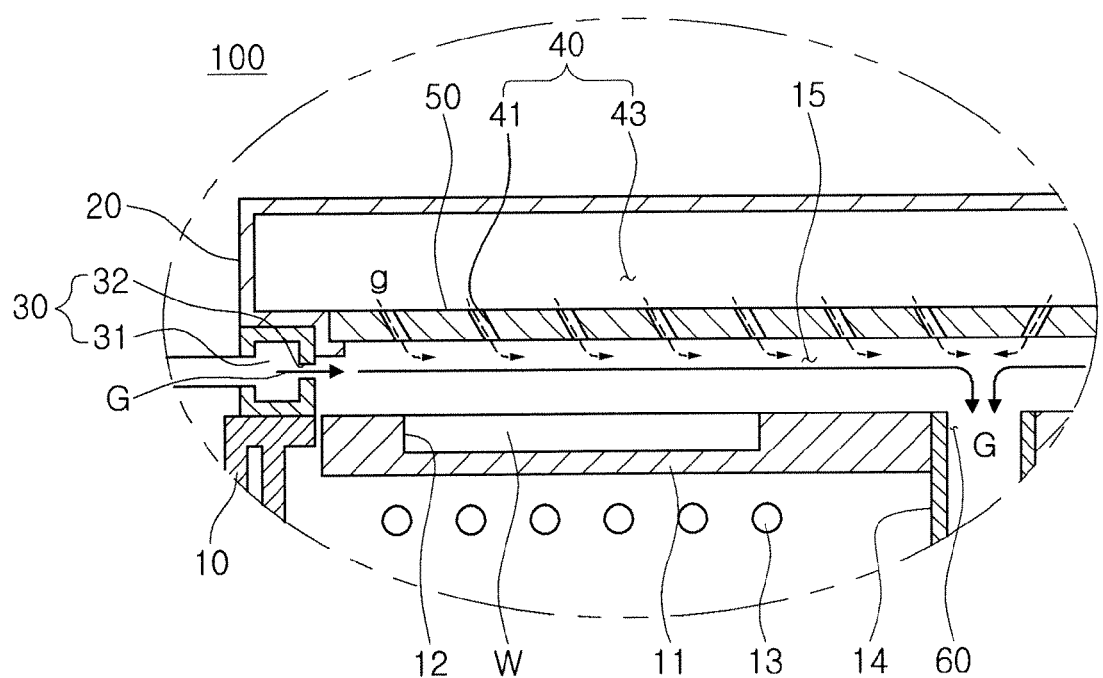
FIG. 6 is a cross-sectional view of a non-reactive gas supplier according to another embodiment of the present invention.
Figure 6B:
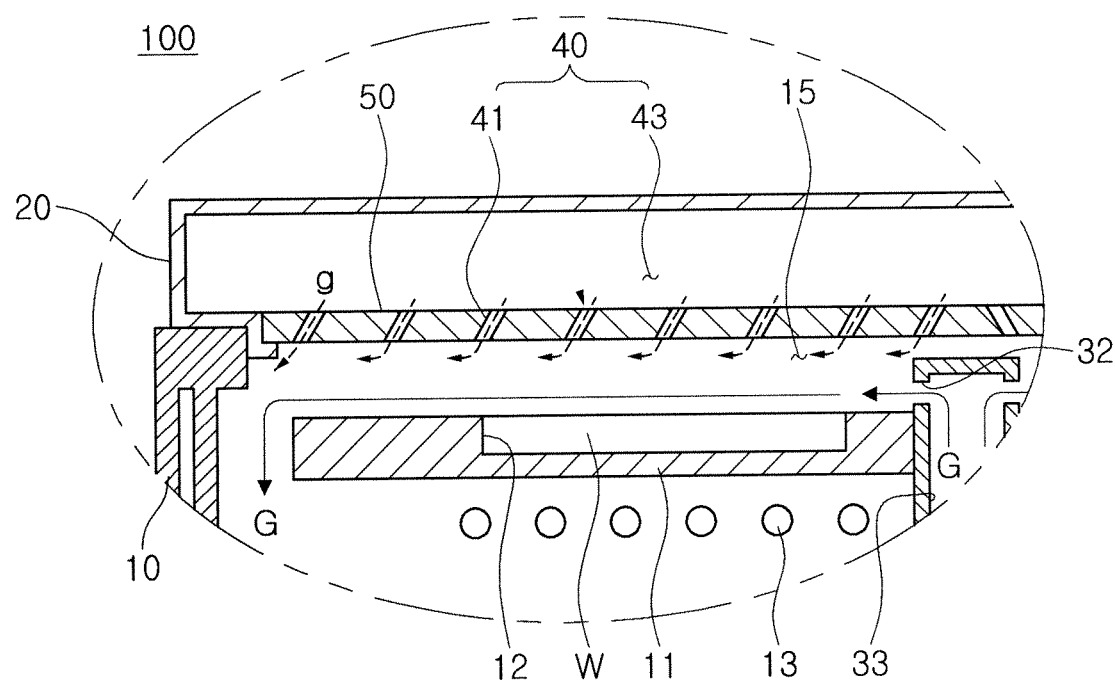
Figure 7A:
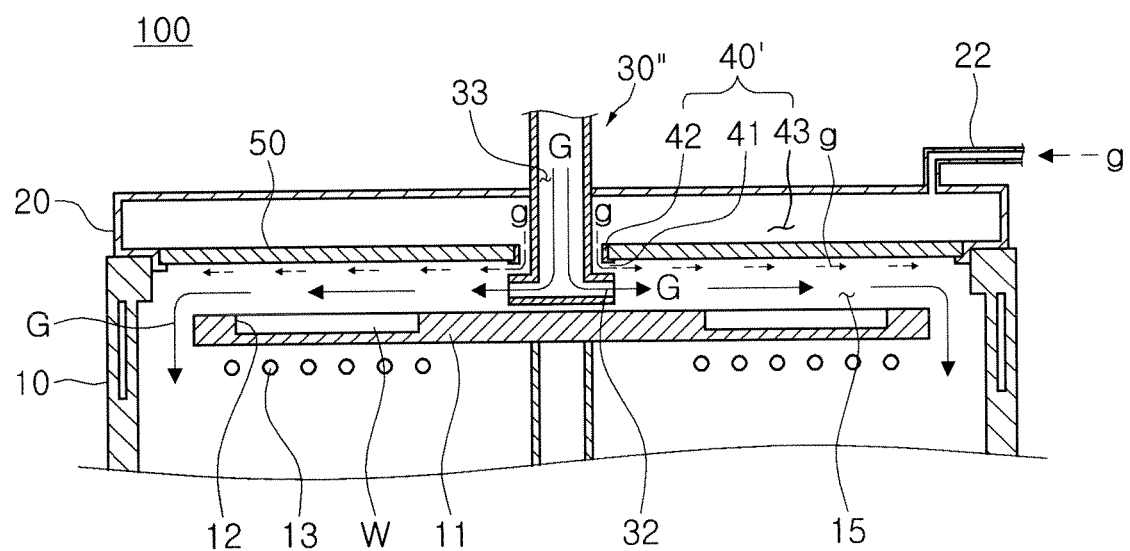
FIGS. 7A and 7B are cross-sectional views of a non-reactive gas supplier provided in connection with a reactive gas supplier shown in FIG. 5 according to another embodiment of the present invention.
Figure 7B:
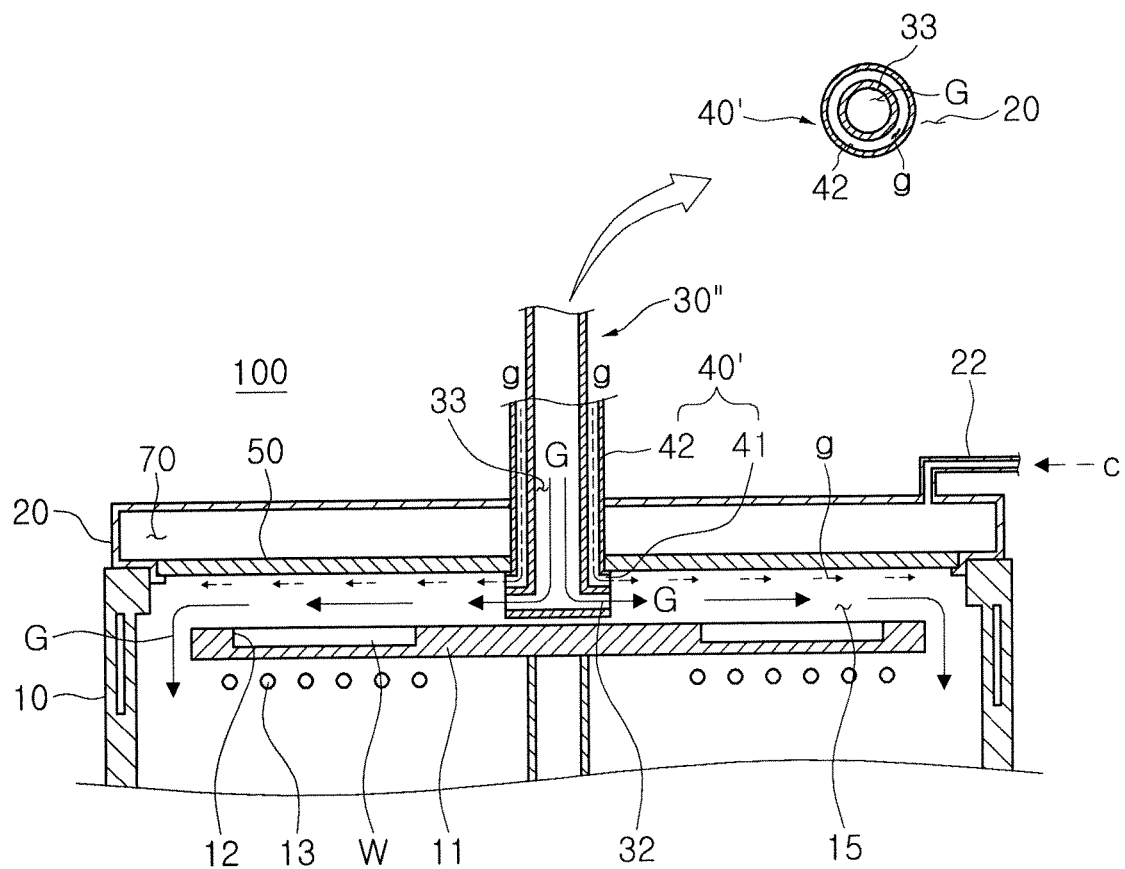
Figure 8A:
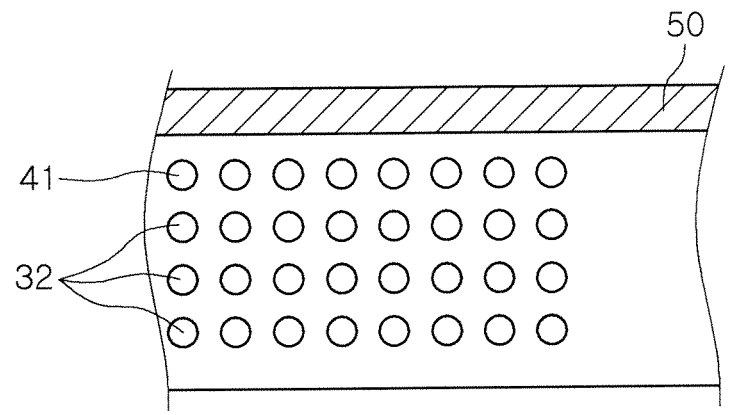
FIGS. 8A and 8B are enlarged views of portions of the reactive gas supplier and the non-reactive gas supplier shown in FIGS. 7A and 7B.
Figure 8B:
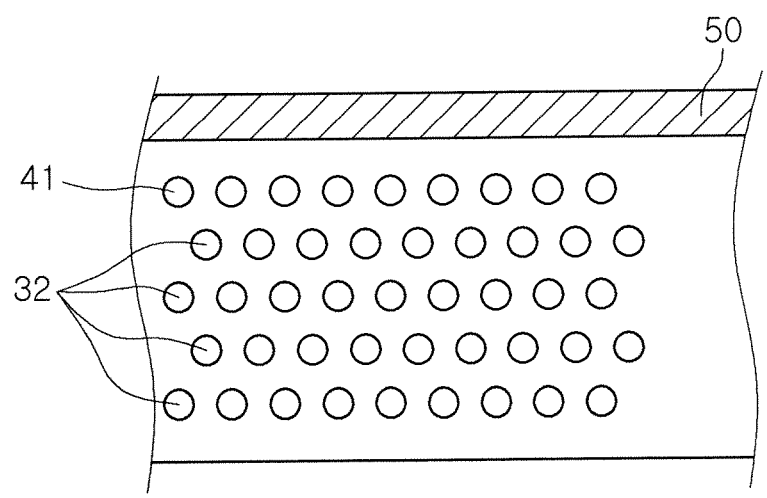
Figure 9A:
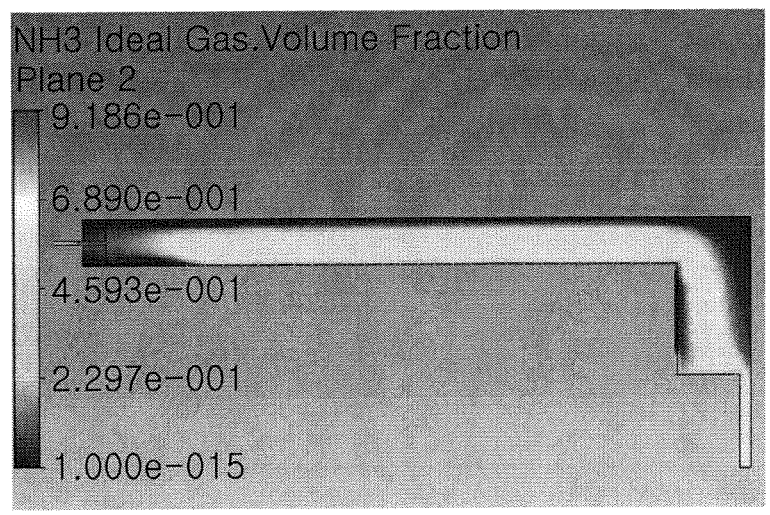
FIGS. 9A and 9B present simulation results schematically representing a flow of a reactive gas and a non-reactive gas according to the structure of the reactive gas supplier and the non-reactive gas supplier shown in FIGS. 7A and 7B.
Figure 9B:
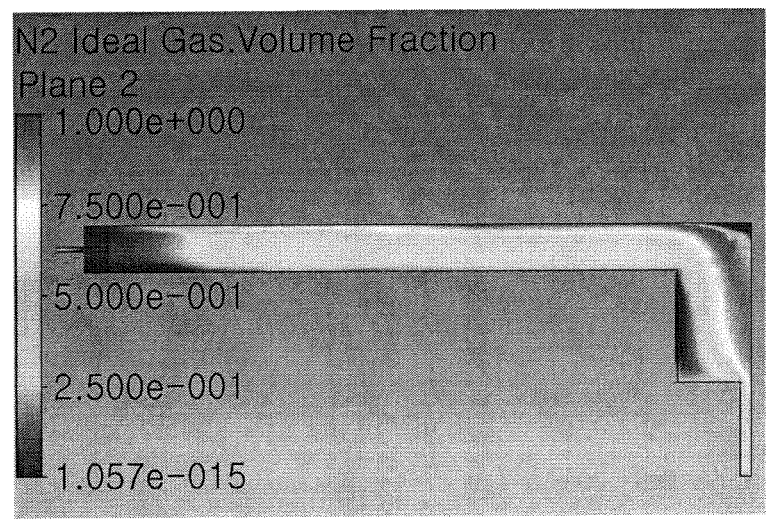
Figure 10:
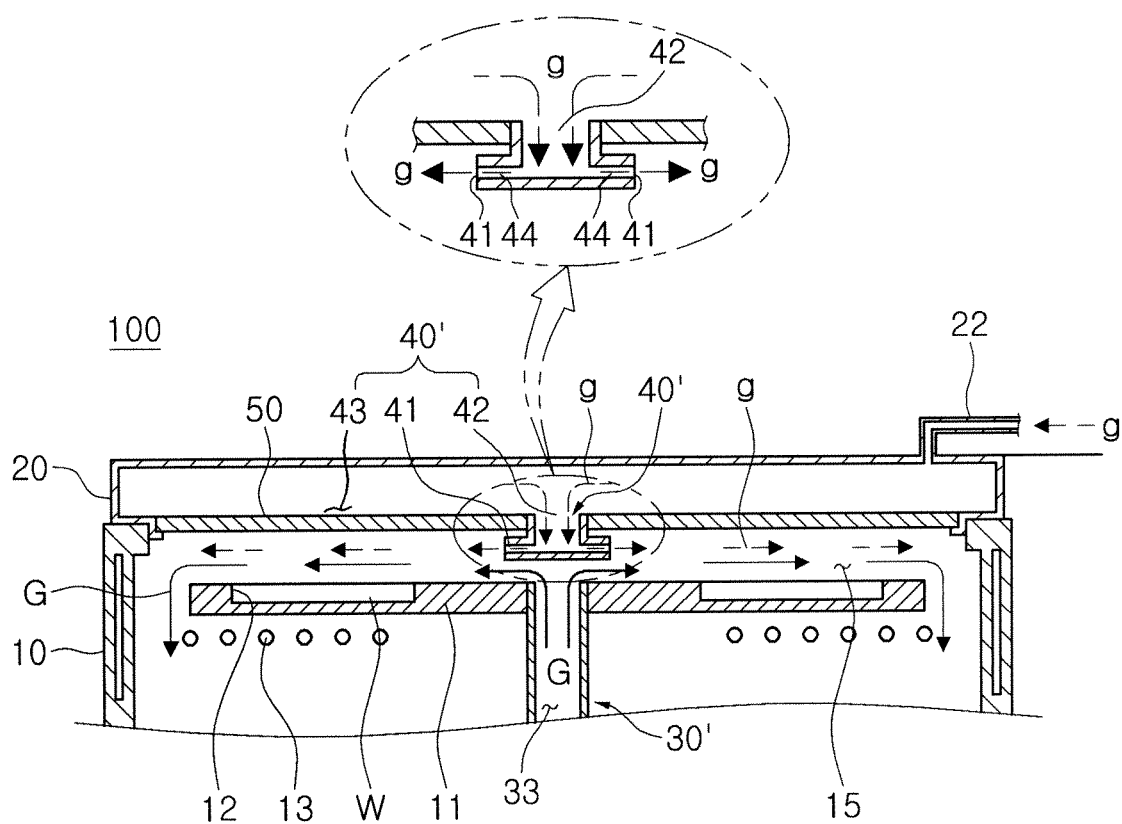
FIG. 10 is a cross-sectional view of a non-reactive gas supplier provided in connection with the reactive gas supplier shown in FIG. 4 according to another embodiment of the present invention.

FIG. 1 is a cross-sectional view of a CVD apparatus according to an embodiment of the present invention. FIG. 2 is a cross-sectional view illustrating a gas flow through a reactive gas supplier and a non-reactive gas supplier shown in FIG. 1. FIG. 3 is a cross-sectional view of a non-reactive gas supplier according to another embodiment of the present invention. FIGS. 4 and 5 are cross-sectional views of a reactive gas supplier according to another embodiment of the present invention. FIG. 6 is a cross-sectional view of a non-reactive gas supplier according to another embodiment of the present invention. FIGS. 7A and 7B are cross-sectional views of a non-reactive gas supplier provided in connection with a reactive gas supplier shown in FIG. 5 according to another embodiment of the present invention. FIGS. 8A and 8B are enlarged views of portions of the reactive gas supplier and the non-reactive gas supplier shown in FIGS. 7A and 7B. FIGS. 9A and 9B present simulation results schematically representing a flow of a reactive gas and a non-reactive gas according to the structure of the reactive gas supplier and the non-reactive gas supplier shown in FIGS. 7A and 7B. FIG. 10 is a cross-sectional view of a non-reactive gas supplier provided in connection with the reactive gas supplier shown in FIG. 4 according to another embodiment of the present invention.

With reference to FIGS. 1 and 2, a CVD apparatus 100 according to an embodiment of the present invention may include a chamber body 10, a chamber cover 20, a reactive gas supplier 30 and a non-reactive gas supplier 40.

The chamber body 10 may include a hollow inner space, and may include a susceptor 11, on which at least one wafer W is safely mounted, and a heating unit 13, in the inside thereof as shown in FIGS. 1 and 2. In an inner upper part of the chamber body 10, opposed to the susceptor 11, a reaction space 15 may be formed, in which a reactive gas G undergoes a chemical reaction. The chamber body 10 may be formed of a metallic material (SUS316L material) prominent in an abrasion resistance, a heat resistance and anti-corrosion.

The susceptor 11 may be formed of a graphite material, and may have a pocket part 12 formed in an upper surface thereof, in which a wafer W to be deposited may be stably mounted. The size of the pocket part 12 may be changed depending upon the size of the wafer W. That is, the pocket part 12 may be formed to be 0.5% to 2% larger than the size (diameter) of the wafer W. When the size of the pocket part 12 is larger than that of the wafer W by 2% or more, the wafer W may move laterally or be biased in one direction. Thus, a uniformity characteristic of a thin film grown on the wafer W may be deteriorated. When the size of the pocket 12 larger than that of the wafer by less than 0.5%, since surplus space may be relatively low at the time of mounting or detaching the wafer W, workability may be degraded.

Meanwhile, a depth of the pocket part 12 may be formed to be about 1% to 30% deeper than a thickness of the mounted wafer W. When the depth of the pocket part 12 is deeper than the thickness of the wafer W by less than 1%, since a bowing effect may occur in the wafer W during a high temperature heating process, the wafer W may not be uniformly heated and may be detached from the pocket part 12 due to revolutions per minute, rotation speed of the susceptor 11. When the depth of the pocket part 12 is 30% or more deeper than the thickness of the wafer W, since a flow of the reactive gas G supplied from the reactive gas supplier 30 may not sufficiently reach the wafer W, deposition uniformity and reactive gas efficiency may be deteriorated, thereby reducing a thickness growth speed of a deposited epitaxial thin film.

In a lower part of the susceptor 11, the heating unit 13 may be provided to supply radiant heat to the susceptor 11 so as to control a temperature of the wafer W mounted in the pocket part 12 of the susceptor 11 such that the temperature thereof ranges from 100 degrees Celsius to 1300 degrees Celsius. The heating unit 13 is an electric heating member generating heat when power is applied thereto. The heating unit 13 may be disposed in a region corresponding to a position in which the pocket part 12 is formed, and may be formed of a material such as copper or tungsten, but is not limited thereto.

The chamber cover 20 may be provided to have a structure in which it airtightly seals the chamber body 10 and maintain a sealing state thereof and it opens and closes the chamber body 10. In addition, the chamber cover 20 may have a non-reactive gas storage chamber 43 formed therein, to store a non-reactive gas (g) in the inside thereof, and a cover member 50 forming the reaction space 15 between the susceptor 11 and the cover member 50. The present embodiment describes a case in which the non-reactive gas storage chamber 43 is formed by the cover member 50 in an inner portion of the chamber cover 20. However, the non-reactive gas storage chamber 43 is not a necessarily formed space, and thus, the chamber cover 20 may be formed with a structure in which a space is not formed in an inner portion thereof. In this case, the cover member 50 may be adhered to a bottom surface of the chamber cover 20. Hereinafter, a structure in which the non-reactive gas storage chamber 43 is provided in an inner portion of the chamber cover 20 will be described.

Though not shown in the drawing, a sealing member such as an O-ring may be provided in a lower end of the chamber cover 20 combined with the chamber body 10 in order to accurately maintain the airtight seal.

The cover member 50 may be circularly shaped to correspond to the shape of the chamber cover 20, and may be combined with a lower part of the chamber cover 20 or to be separable therefrom, to block or open the inside of the chamber cover 20 such that the reaction space 15 is formed between the susceptor 11 and the cover member. The cover member 50 may be provided to prevent the reactive gas G from contacting the inner portion of the chamber cover 20 and prevent a dummy coating from being attached to the inner portion surface of the chamber cover 20 during a deposition process. Further, heat may be blocked so as not to cause heat deformation of the chamber cover 20 under a relatively high temperature atmosphere. The cover member 50 may be formed of a material having excellent heat resistance, for example, quartz or graphite coated with SiC, or the like. The cover member may be formed to have a thickness of about 3 mm to 20 mm, but is not limited thereto.

The cover member 50 may be disposed to form a horizontal structure with the susceptor 11 such that the reactive gas G flowing in the reaction space 15 may have a stabilized laminar flow. Further, a height of the reaction space 15 corresponding to an interval between an upper surface of the susceptor 11 and a lower surface of the cover member 50 may range from 10 mm to 100 mm. When the height of the reaction space 15 is less than 10 mm, a flow of the reactive gas may not be stabilized and thus, deposition uniformity may be deteriorated. When the height of the reaction space 15 is greater than 100 mm, since efficiency of a gas reaching from the reactive gas supplier to an upper surface of a wafer is degraded, a deposition speed may be relatively reduced.

The cover member 50 may be formed to have a plurality of division members which are combined with one another, or may be formed of a single member. By this configuration of a single member or division members, the dummy coating attached to a surface of the cover member 50 exposed to the reaction space 15 may be removed, or a defective cover member 50 having, for example, a crack, may be replaced with a new one. In particular, in a case in which the cover member 50 is configured of a plurality of division members combined with one another, since a corresponding defective division member may only be replaced with a new one, the maintenance of the apparatus may be facilitated.

The chamber cover 20 may have the non-reactive gas supplier 40 to be described below, such that a deposition material may be prevented from being attached to the surface of the cover member 50 provided as a ceiling of the chamber body 10 due to parasitic deposition.

The reactive gas supplier 30 may supply the reactive gas G to the reaction space 15 such that it flows across the surface of the susceptor 11, between the susceptor 11 and the cover member 50 opposed to each other. In detail, the reactive gas supplier 30 may have an inverse-radial type structure and be disposed in an upper part of the chamber body 10 combined with the chamber cover 20. The reactive gas G may be TMGa, TEGa, TMAl, TMIn, NH3, or the like.

This reactive gas supplier 30 may include at least one reactive gas storage chamber 31 disposed around a side surface of the chamber body 10, to store the reactive gas G introduced from the outside thereinto, and a reactive gas nozzle 32 communicating the reactive gas storage chamber 31 with the reaction space 15 to release the reactive gas G stored in the reactive gas storage chamber 31 into the reaction space 15. For example, in a case in which the reactive gas storage chamber 31 is provided as a single reactive gas storage chamber, raw gas and a carrier gas may be stored to be mixed and released as a mixed gas, or only a raw gas may be stored and released, through the reactive gas storage chamber 31. In addition, the reactive gas storage chamber 31 may include at least one partition (not shown) formed within the reactive gas storage chamber 31 so as to be separated into a plurality of internal regions therein. In this case, the reactive gas may be released by constant pressure, and respective reactive gases may also be released to be respectively distinguished. The reactive gas storage chamber 31 may be arranged to occupy an area ranging from about 1% to about 10% of the reaction space 15. When the size of the reactive gas storage chamber 31 storing the reactive gas G is less than 1% of the reaction space 15, the reactive gas G may not be sufficiently mixed in advance, and therefore, deposition uniformity of the reactive gas G may be degraded. When the size of the reactive gas storage chamber 31 is greater than 10% of the reaction space 15, the size of the chamber body 10 may be relatively large, so space efficiency may be deteriorated.

The reactive gas G supplied to the reaction space 15 through the reactive gas supplier 30 may flow from the periphery of the chamber body 10 to a center thereof, and then, may be exhausted to the outside through a gas exhaust 60 disposed in a central portion of a center axis 14 of the susceptor 11.

Meanwhile, the reactive gas supplier 30' or 30" may have a radial type structure formed along a central axis of the chamber cover 20 or the chamber body 10 such that the reactive gas G flows to have a gas flow direction from a center of the chamber body 10 to the periphery thereof as shown in FIGS. 4 and 5.

Described in detail, as shown in FIG. 4, the reactive gas supplier 30' according to another embodiment of the present invention may include at least one reactive gas introduction passage 33 and a reactive gas nozzle 32. The at least one reactive gas introduction passage 33 may be disposed within a central axis part of the susceptor 11 to introduce the reactive gas G from the outside. The reactive gas nozzle 32 may release the reactive gas G introduced through the reactive gas introduction passage 33 into the reaction space 15, the reactive gas G flowing to form a radial gas flow from a center of the susceptor 11 to the periphery thereof. The reactive gas nozzles 32 may be formed to have a size ranging from about 1 mm to 10 mm. When the reactive gas nozzles 32 are smaller than 1 mm, a flow speed of the reactive gas G is relatively rapid, and thus, it may be difficult to obtain a uniform laminar flow therewith. When the size of the reactive gas nozzles 32 is greater than 10 mm, a flow speed of the reactive gas G is relatively slow, and thus, gas efficiency may be deteriorated and a deposition speed may be decreased.

In addition, with reference to FIG. 5, the reactive gas supplier 30" according to another embodiment of the present invention may include the reactive gas introduction passage 33 and the reactive gas nozzle 32. The reactive gas introduction passage 33 may be formed to penetrate a center of the chamber cover 20 to introduce the reactive gas G from the outside. The reactive gas nozzle 32 may release the reactive gas G introduced through the reactive gas introduction passage 33 into the reaction space 15, the reactive gas G flowing to have a radial gas flow directed from a center of the chamber cover 20 to the periphery thereof. Herein, the reactive gas introduction passage 33 may be extended by a predetermined length toward to the susceptor 11 such that the released reactive gas G may flow across the surface of the susceptor 11.

FIG. 5 illustrates a single reactive gas introduction passage 33, but is not limited thereto, and a plurality of reactive gas introduction passages 33 may be applied. In this case, gases may be released into the reaction space 15 through respective reactive gas introduction passages depending on the kind of reactive gases. The reactive gas G supplied through the reactive gas introduction passage 33 may be radially released from the center part of the susceptor 11 to the periphery part thereof through the reactive gas nozzles 32. Then, the reactive gas G may be exhausted to the outside through the gas exhaust part (not shown) disposed around the side edge or on a lower portion of the chamber body 10.

The non-reactive gas supplier 40 may supply the non-reactive gas (g) to the reaction space 15 such that the non-reactive gas (g) flows across the surface of the chamber cover 20, in detail, the surface of the cover member 50, between the susceptor 11 and the chamber cover 20, thereby preventing the reactive gas G from contacting the surface of the chamber cover 20. That is, parasitic deposition may be prevented from occurring on the surface of the cover member 50 that is provided as a ceiling of the chamber body 10, by the reactive gas G flowing in the reaction space 15. The non-reactive gas (g) may be H2, N2, or the like.

As shown in FIG. 1, the non-reactive gas supplier 40 may include a plurality of non-reactive gas nozzles 41 formed to penetrate the cover member 50 in a direction toward the susceptor 11. The plurality of non-reactive gas nozzles 41 may be disposed across the entire region of the cover member 50, to correspond to a flow direction of the reactive gas G released from the reactive gas nozzles 32 at a position corresponding to the reactive gas nozzles 32 of the reactive gas supplier 30, or to correspond to a position on which the wafer W to undergo a chemical reaction is mounted.

The plurality of non-reactive gas nozzles 41 penetrating the cover member 50 may communicate with the non-reactive gas storage chamber 43 provided in an inner portion of the chamber cover 20, to release the non-reactive gas (g) stored in the non-reactive gas storage chamber 43 through an external pipe 22 into the reaction space 15. In addition, as shown in FIG. 3, the plurality of non-reactive gas nozzles 41 formed to penetrate the cover member 50 may be disposed to be directly communicate with a non-reactive gas introduction passage 42 for introducing the non-reactive gas (g) from the outside of the chamber cover 20, such that the plurality of non-reactive gas nozzles release the non-reactive gas (g) into the reaction space 15. Here, a refrigerant storage chamber 70, instead of the non-reactive gas storage chamber 43, may be included in the chamber cover 20, the refrigerant storage chamber 70 being filled with a refrigerant C such as a coolant, so as to refrigerate not only the cover member 50 but the chamber cover 20, thereby suppressing the generation of deposition material.

The plurality of non-reactive gas nozzles 41 may be configured to slope so as to correspond to a flow direction of the reactive gas G supplied through the reactive gas supplier 30. In detail, as shown in FIG. 6A, in case in which the reactive gas supplier 30 is disposed around the side surface of the chamber body such that the reactive gas G flows to have an inverse-radial flow, the non-reactive gas nozzles 41 may slope so as to be directed toward the center of the chamber cover 20, such that the non-reactive gas flows to follow a flow of the reactive gas G. Further, as shown in FIG. 6B, in a case in which the reactive gas supplier 30' is disposed along a central axis of the chamber body 10 such that the reactive gas G flows to have a radial type flow, the non-reactive gas nozzles 41 may be configured to slope so as to be directed toward an outer circumference of the chamber cover 20, such that the non-reactive gas may flow to follow a flow of the reactive gas G. As such, according to the embodiment of the present invention, as the non-reactive gas nozzles 41 may be configured to slope so as to correspond to the flow direction of the reactive gas, the reactive gas G may not be affected by the non-reactive gas (g), thereby allowing for a stable laminar flow of the reactive gas while the reactive gas G can be secured to be prevented from contacting the cover member 50.

FIGS. 7A and 7B are cross-sectional views of a non-reactive gas supplier provided in connection with a reactive gas supplier shown in FIG. 5 according to another embodiment of the present invention. In detail, as shown in FIG. 7A, the non-reactive gas supplier 40' may include a non-reactive gas introduction passage 42 and non-reactive gas nozzles 41. The non-reactive gas introduction passage 42 may be extended toward the susceptor 11 while penetrating the cover member 50. The non-reactive gas nozzles 41 may be formed along the circumference of the non-reactive gas introduction passage 42 extended into the reaction space 15, to radially release the non-reactive gas (g) into the reaction space 15. The non-reactive gas nozzles 41 may be a plurality of non-reactive gas nozzles. The non-reactive gas introduction passage 42 may communicate with the non-reactive gas storage chamber 43 to introduce the non-reactive gas (g) received in an inner portion thereof to the reaction space 15.

As shown in FIG. 7B, the non-reactive gas supplier 40' may include the non-reactive gas introduction passage 42 extended toward the susceptor 11 while penetrating the chamber cover 20 together with the cover member 50; and the non-reactive gas nozzles 41 formed along a circumferential surface of the non-reactive gas introduction passage 42 extended to the reaction space 15 to radially release the non-reactive gas (g). The non-reactive gas nozzles 41 may be a plurality of non-reactive gas nozzles. Further, the non-reactive gas introduction passage 42 may be extended to the outside of the chamber cover 20 to release the non-reactive gas (g) into the reaction space 15 while directly introducing the non-reactive gas (g). In this case, the chamber cover 20 may include a refrigerant storage chamber 70 therein, instead of the non-reactive gas storage chamber 43, filled with a refrigerant C such as a coolant.

Meanwhile, the reactive gas supplier 30" may be provided along the center of the chamber cover 20 in a structure for forming a radial reactive gas flow as shown in FIG. 5.

As such, in the case in which the reactive gas introduction passage 33 of the reactive gas supplier 30" is provided to penetrate the center of the chamber cover 20, the non-reactive gas introduction passages 42 may be provided along the circumference of the reactive gas introduction passage 33. In detail, the non-reactive gas introduction passage 42 provided to penetrate the cover member 50 may have a diameter greater than that of the reactive gas introduction passage 33 such that it may receive the reactive gas introduction passage 33 in an inner portion thereof, whereby the non-reactive gas (g) may be introduced into the reaction space 15 through a space between the reactive gas introduction passage 33 and the non-reactive gas introduction passage 42. The non-reactive gas introduction passage 42 may be formed to have a length shorter than that of the reactive gas introduction passage 33. That is, when the reactive gas introduction passage 33 is extended from a lower end of the non-reactive gas nozzle 42 toward the susceptor 11 to be relatively longer, the reactive gas nozzles 32 may be provided along a circumferential surface of the reactive gas introduction passage 33 extended from the lower end of the non-reactive gas introduction passage 42, such that the reactive gas nozzles 32 are exposed from the lower end of the non-reactive gas introduction passage 42 toward the reaction space 15. Therefore, the plurality of non-reactive gas nozzles 41 may be disposed between the cover member 50 and the reactive gas nozzles 32, and may also be disposed to be closer to the cover member 50 than the reactive gas nozzles 32 provided with the reactive gas introduction passage 33. In detail, as shown in FIGS. 8A and 8B, the plurality of non-reactive gas nozzles 41 may be arranged along the circumference of the non-reactive gas introduction passage 42 to be spaced apart from one another with predetermined interval therebetween such that they are disposed to be adjacent to the cover member 50. The reactive gas nozzles 32 may be arranged together with the non-reactive gas nozzles 41 and may be disposed in a portion lower (near the susceptor 11) than an arrangement position of the non-reactive gas nozzles 41, based on the cover member 50. FIGS. 8A and 8B show the case in which the non-reactive gas nozzles 41 have one arrangement and the reactive gas nozzles 32 have several arrangements, but are not limited thereto. The number of respective arrangements may be varied. The arrangement of the non-reactive gas nozzles 41 and the arrangement of the reactive gas nozzles 32 may be provided to be side by side as shown in FIG. 8A or may be alternated with one another in a zigzag manner as shown in FIG. 8B.

FIGS. 9A and 9B present simulation results schematically representing a flow of a reactive gas and a non-reactive gas according to the structure of the reactive gas supplier and the non-reactive gas supplier shown in FIGS. 7A and 7B. As shown in FIG. 9A, the reactive gas G does not contact the cover member 50 due to the non-reactive gas (g), but it can be confirmed that the reactive gas G flows in a lower part thereof, adjacent to the susceptor 11. Further, it can be confirmed as shown in FIG. 9B that the non-reactive gas (g) mostly flows across the surface of the cover member 50.

FIG. 10 is a cross-sectional view of a non-reactive gas supplier provided in connection with the reactive gas supplier of FIG. 4 according to another embodiment of the present invention.

The non-reactive gas supplier 40' shown in FIG. 10 may include the non-reactive gas introduction passage 42 extended toward the susceptor 11 while penetrating the cover member 50 as shown in FIG. 7; the plurality of non-reactive gas nozzles 41 formed along the circumferential surface of the non-reactive gas introduction passage 42 extended to the reaction space 15 to radially release the non-reactive gas (g); and a connection part 44 connecting the non-reactive gas introduction passage 42 to the non-reactive gas nozzles 41. In this case, the reactive gas supplier 30' may be provided along the center of the susceptor 11 to have a structure forming a radial type reactive gas flow as shown in FIG. 4.

The connection part 44 may have a lower end positioned in a location between 5% to 50% of a distance between the susceptor 11 and the cover member 50 forming the reaction space 15 toward the susceptor 11 based on the cover member 50. When the lower end of the connection part 44 is positioned in a location less than 5% of the distance from the cover member 50 to the susceptor 11, a flow level of the non-reactive gas (g) may be relatively low, such that the non-reactive gas (g) may not be sufficiently transferred to an edge of the reaction space 15, whereby an effect of blocking the reactive gas G through the non-reactive gas (g) may not be sufficiently obtained. In addition, when the lower end of the connection part 44 is positioned in a location of 50% or more of the distance from the cover member 50, since a flow of the reactive gas G may be excessively affected, a laminar flow may be interfered and a film uniformity characteristic may be deteriorated.

The positional range of the connection part 44 within the reaction space 15 may be also applied to the non-reactive gas nozzles 41 connected to the non-reactive gas introduction passage 42, but not through the connection part 44, the non-reactive gas introduction passage 42 being exposed to the reaction space 15.

According to another embodiment of the present invention, a CVD apparatus will be described with reference to FIGS. 11 to 17.

Figure 11:
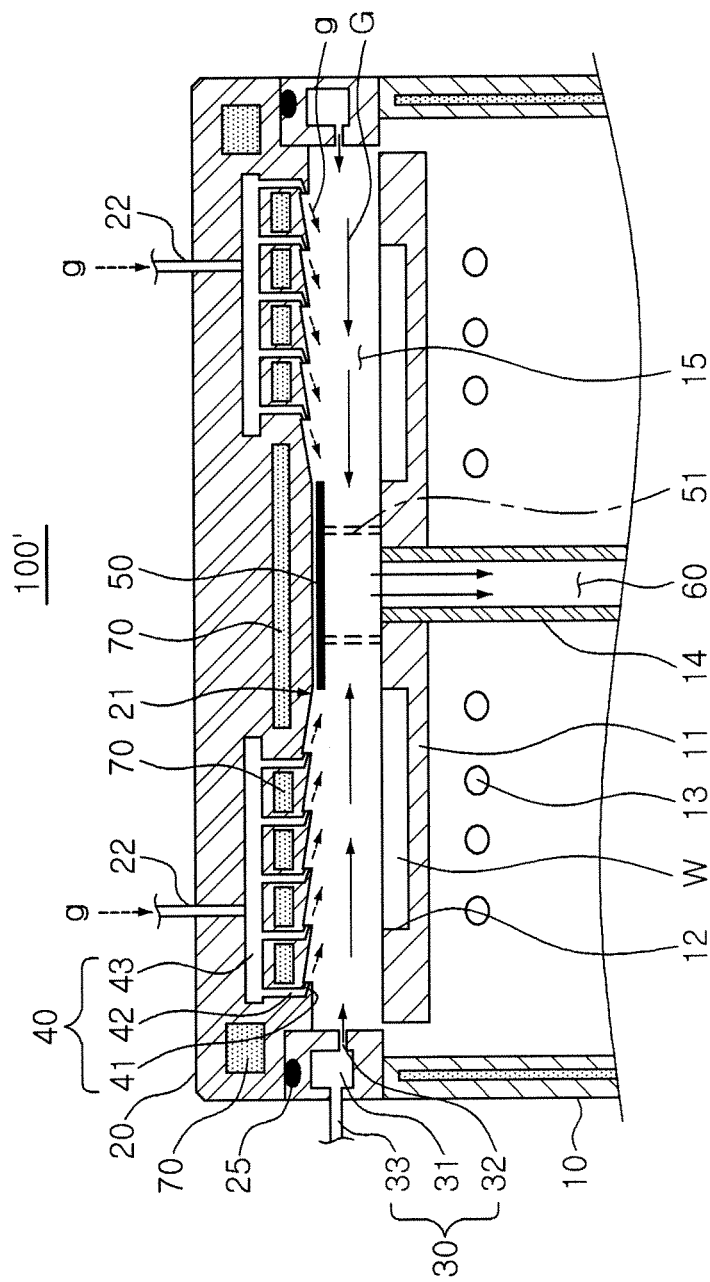
FIG. 11 is a schematic cross-sectional view of a CVD apparatus according to another embodiment of the present invention.
Figure 12:
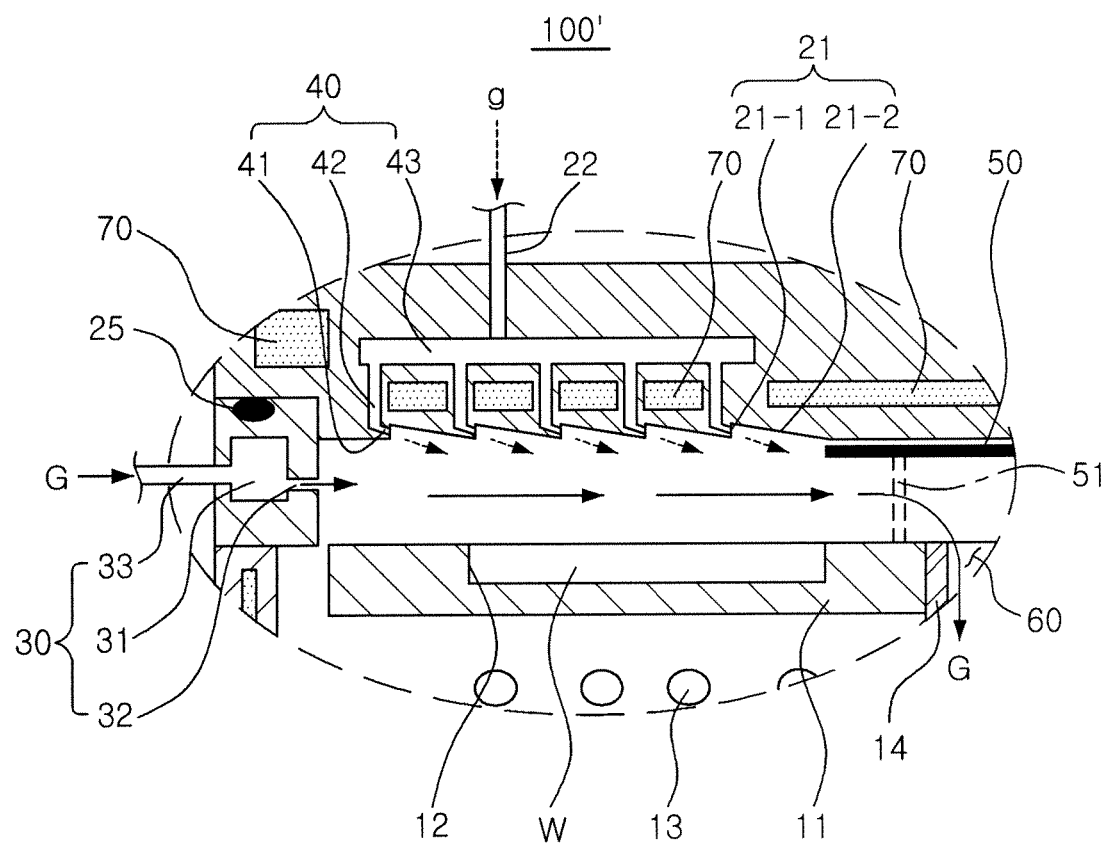
FIG. 12 is a schematic cross-sectional view illustrating a gas flow through a reactive gas supplier and a non-reactive gas supplier shown in FIG. 11.
Figure 13:
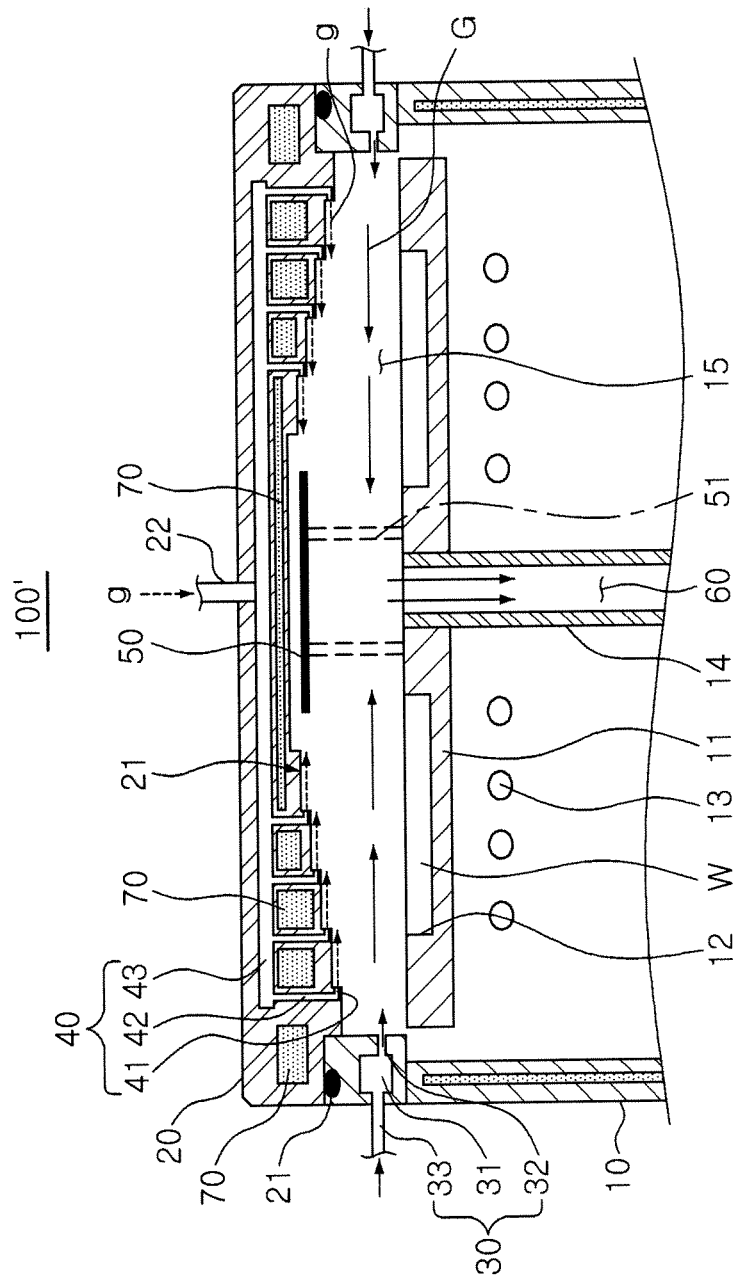
FIG. 13 is a schematic cross-sectional view showing an embodiment of the non-reactive gas supplier shown in FIG. 11.
Figure 14:
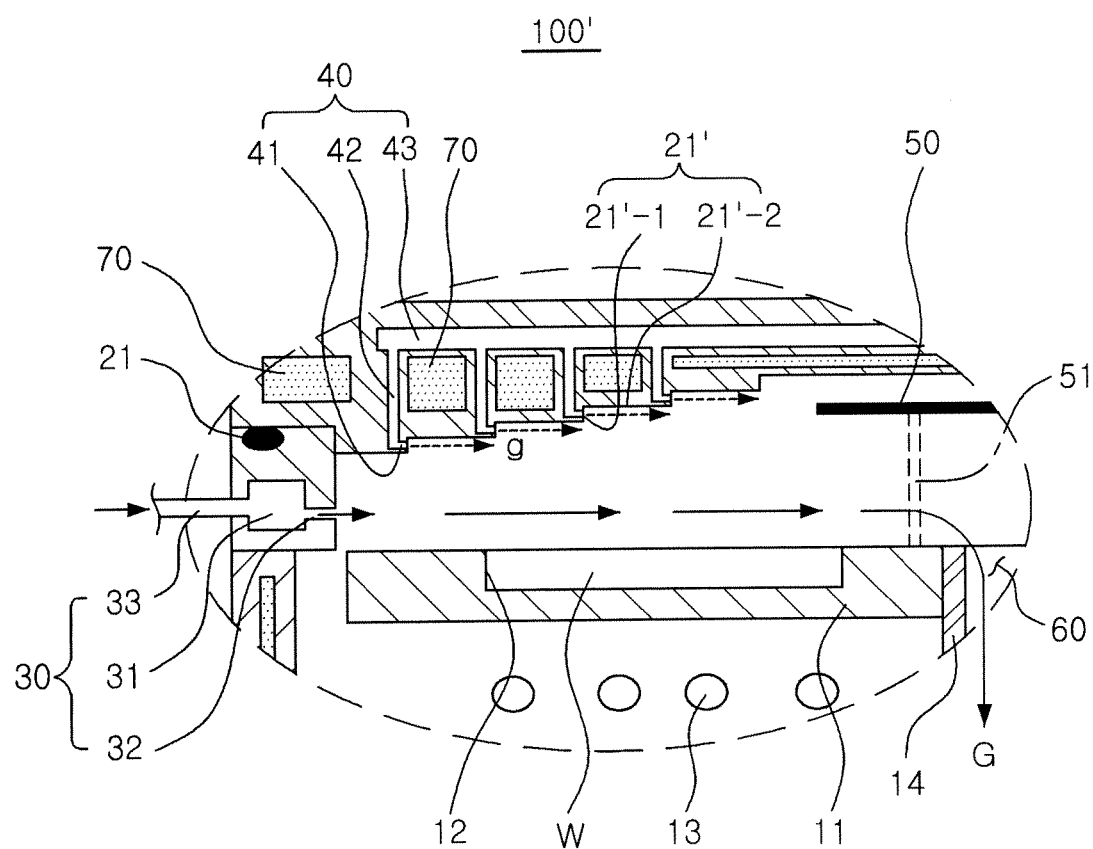
FIG. 14 is a cross-sectional view showing a gas flow through a reactive gas supplier and a non-reactive gas supplier shown in FIG. 13.
Figure 15:
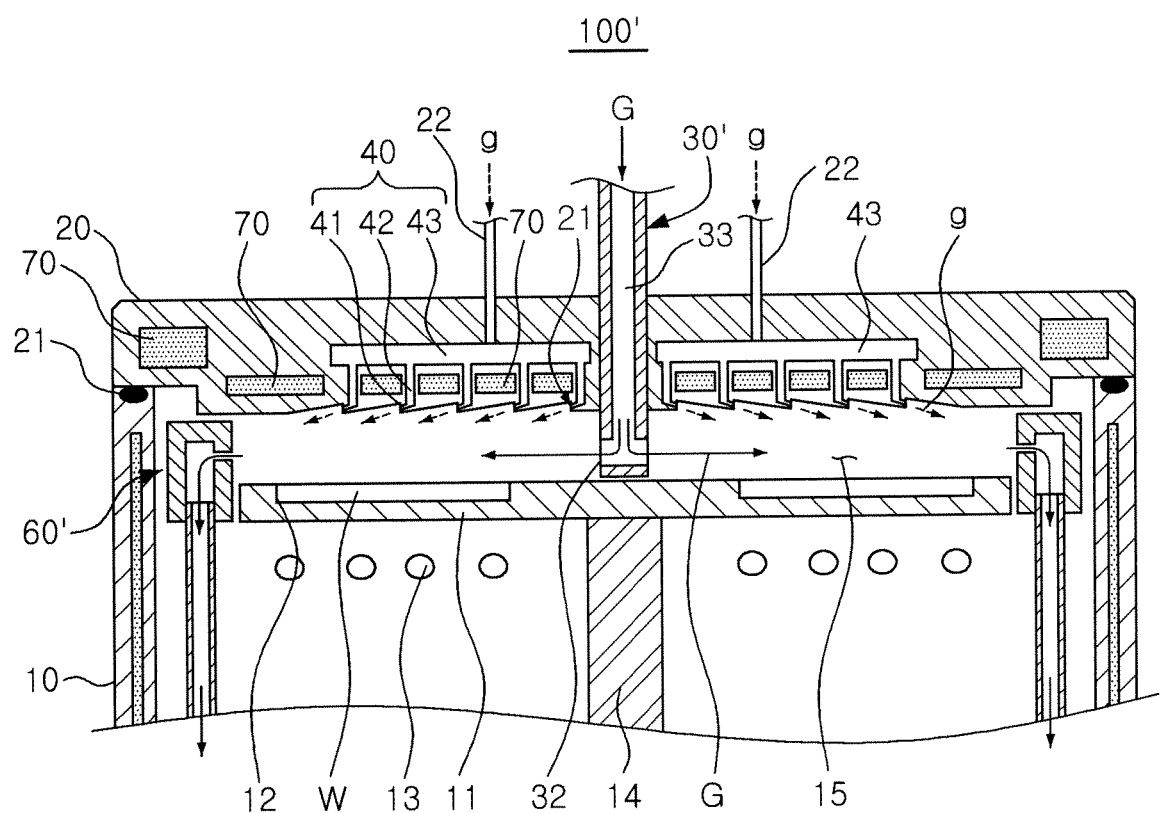
FIG. 15 is a cross-sectional view of a CVD apparatus according to another embodiment of the present invention.
Figure 16:
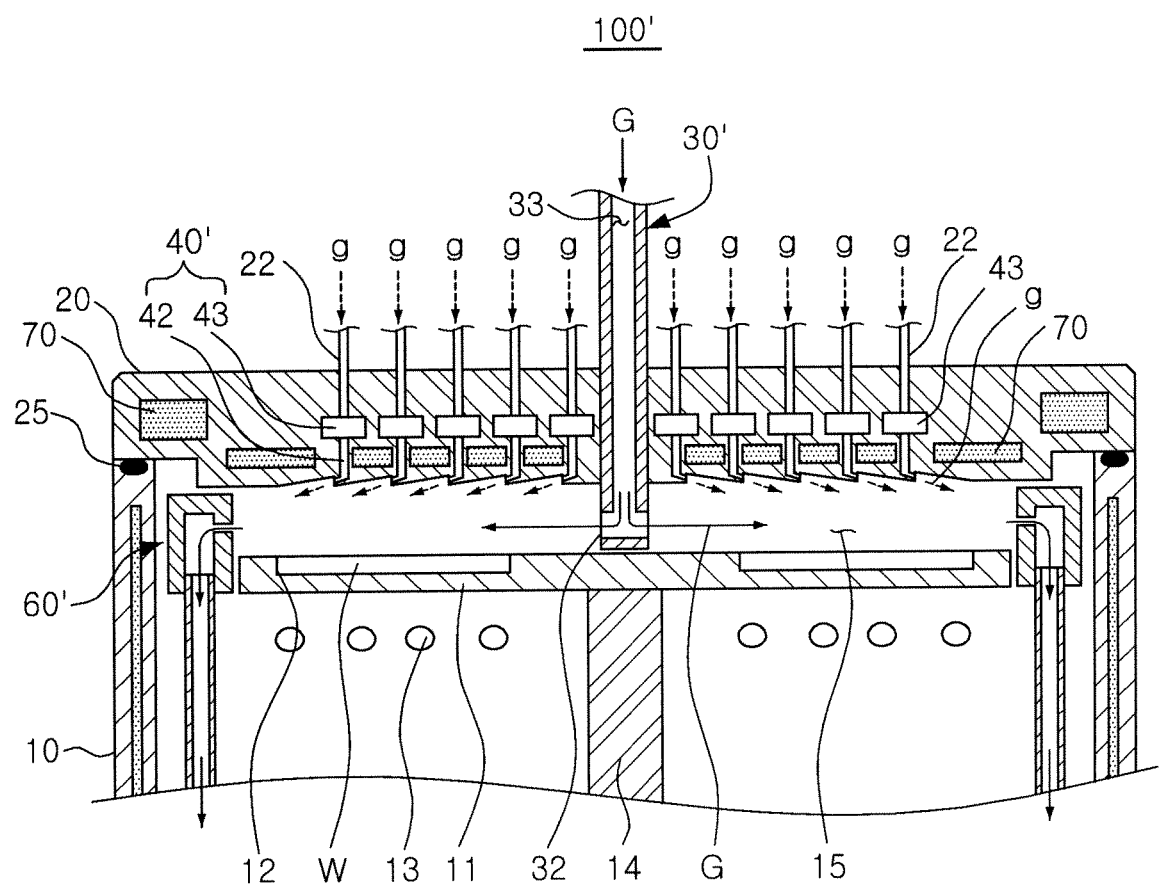
FIG. 16 is a cross-sectional view showing an embodiment of the non-reactive gas supplier shown in FIG. 15.
Figure 17:
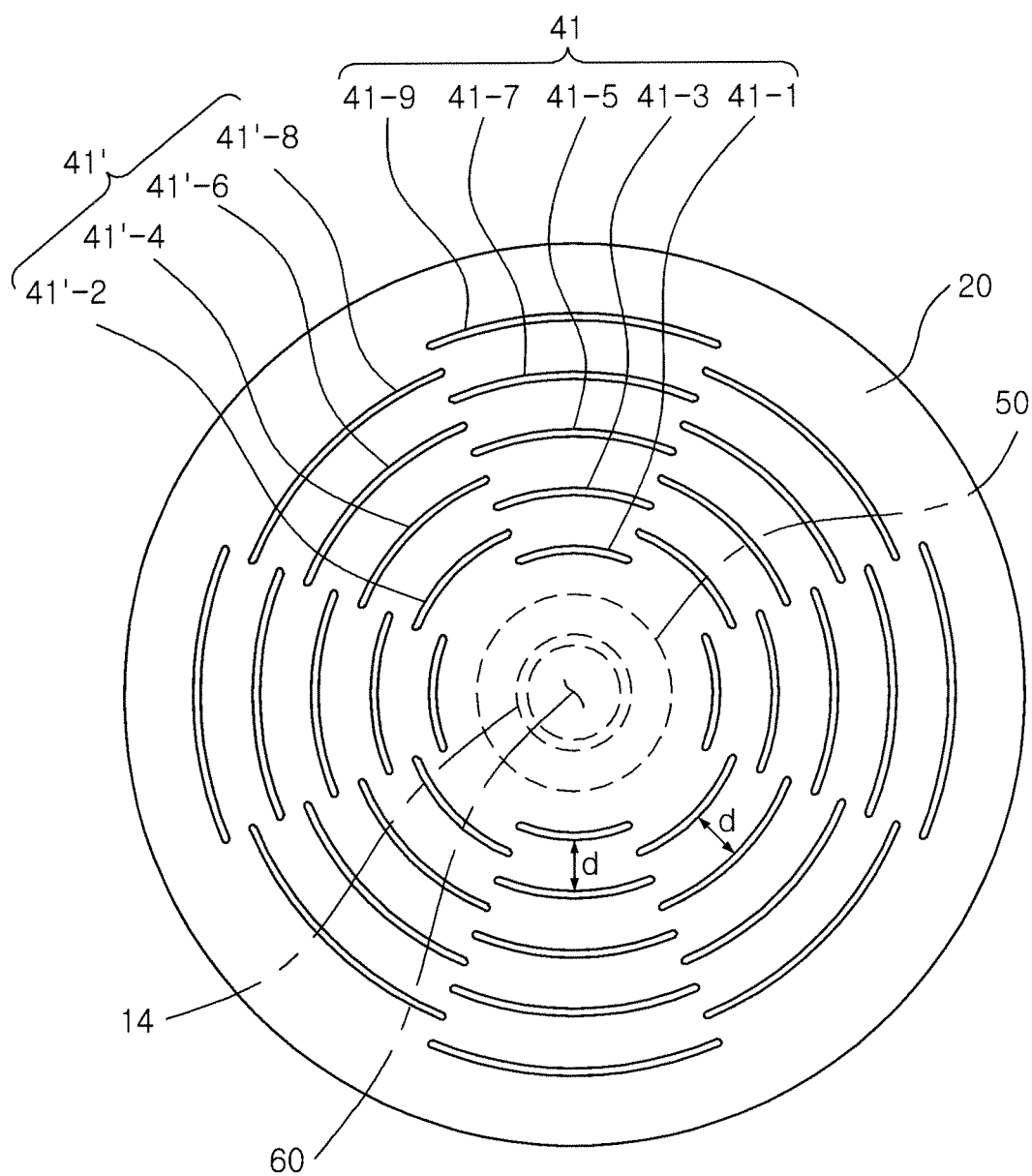
FIG. 17 illustrates the structure of a non-reactive gas nozzle of the non-reactive gas supplier shown in FIGS. 11 to 16.

FIG. 11 is a cross-sectional view of a CVD apparatus according to another embodiment of the present invention. FIG. 12 is a cross-sectional view illustrating a gas flow through a reactive gas supplier and a non-reactive gas supplier shown in FIG. 11. FIG. 13 is a cross-sectional view of a non-reactive gas supplier according to another embodiment of the present invention. FIG. 14 is a cross-sectional view illustrating a gas flow through a reactive gas supplier and a non-reactive gas supplier shown in FIG. 13. FIG. 15 is a cross-sectional view of a CVD apparatus shown in FIG. 11 according to another embodiment of the present invention. FIG. 16 is a cross-sectional view of a non-reactive gas supplier shown in FIG. 15 according to another embodiment of the present invention. FIG. 17 is a plan view illustrating a structure of the carrier gas nozzles of the carrier gas supplier shown in FIGS. 11 to 16.

With reference to FIGS. 11 to 14, a CVD apparatus 100' according to another embodiment of the present invention may include a chamber body 10, a chamber cover 20, a reactive gas supplier 30, and a non-reactive gas supplier 40.

The chamber body 10 may have a hollow internal space and may include a susceptor 11 on which at least one wafer W is safely mounted, and a heating unit 13 in the inside thereof as shown in FIGS. 11 to 16. In an upper part of the susceptor 11, a reaction space 15 may be formed to have a chemical reaction of a reactive gas G therein. The chamber body 10 may be formed of a metallic material prominent in an abrasion resistance, a heat resistance and anti-corrosion.

The susceptor 11 may be located in a central portion of the chamber body 10, such that a center of the chamber body 10 and a central axis of the susceptor 11 may be aligned. The susceptor 11 may include at least one discus-shaped pocket part 12 formed to be recessed in an upper surface thereof, in which the wafer W to be deposited may be stably mounted. In a lower part of the susceptor 11, the heating unit 13 may be provided to supply radiant heat to the susceptor 11 so as to heat the wafer W mounted on the susceptor 11. The heating unit 13 may be an electric heating member generating heat when power is applied thereto. The heating unit 13 may be disposed in a region corresponding to a position in which the pocket part 12 is formed.

The chamber cover 20 may be combined with the chamber body 10 to airtightly seal the chamber body 10 and maintain a sealing state thereof, and may be configured to open and close the chamber body 10. In combining the chamber cover 20 with the chamber body 10, the reaction space 15 may be formed between the chamber cover 20 and the susceptor 11. A sealing member 25 such as an O-ring may be disposed at a lower end of the chamber cover 20 combined with the chamber body 10 in order to maintain the integrity of a seal.

The chamber cover 20 may include a plurality of step parts 21 that are formed on a lower surface of the chamber cover 20 exposed to the reaction space 15, the step parts 21 being radially formed to have the form of concentric circles on a central portion of the chamber cover 20. The non-reactive gas supplier 40 may be disposed in the chamber cover 20 to be described below, such that a deposition material is prevented from being attached to a surface of the chamber cover 20 provided as a ceiling of the chamber body 10 due to a parasitic deposition. The non-reactive gas supplier 40 may be disposed in a position on which the step parts 21 are formed, and may communicate with the reaction space 15, to supply a non-reactive gas (g) to the reaction space 15. This will be described below in greater detail.

The chamber cover 20 may also include the refrigerant storage chamber 70 in addition to the constitution of the non-reactive gas supplier 40, to refrigerate the non-reactive gas supplier 40 and the chamber cover 20.

The reactive gas supplier 30 may supply the reactive gas G to the reaction space 15 such that the reactive gas G flows across the surface of the susceptor 11 between the susceptor 11 and the chamber cover 20 opposed to each other. In detail, the reactive gas supplier 30 may have an inverse-radial structure and may be disposed in an upper part of the chamber body 10 that is combined with the chamber cover 20. By the inverse-radial structure of the reactive gas supplier 30, the reactive gas G may have a gas flow directed from the vicinity of the chamber body 10 to a center thereof as shown in the drawings. The reactive gas G may be TMGa, TEGa, TMAl, TMIn, NH3 or the like.

This reactive gas supplier 30 may include at least one reactive gas storage chamber 31 disposed around a side surface of the chamber body 10, to store the reactive gas G introduced from the outside thereinto through the reactive gas introduction passage 33, and reactive gas nozzles 32 communicating with the reactive gas storage chamber 31 and the reaction space 15 to release the reactive gas G stored in the reactive gas storage chamber 31 to the reaction space 15. For example, when the reactive gas storage chamber 31 is provided singularly, raw gases may be stored to be mixed and then released, or only a single raw gas may be stored and released, through the reactive gas storage chamber 31. In addition, the reactive gas storage chamber 31 may include at least one partition part (not shown) formed within the reactive gas storage chamber 31 so as to be separate the interior of the reactive gas storage chamber 31 into a plurality of internal regions. In this case, the reactive gas G may be released by a constant pressure, and respective reactive gases may be also released to be respectively distinguished. The reactive gas G, supplied to the reaction space 15 through the reactive gas supplier 30, may flow from the periphery of the chamber body 10 to a center thereof, and then, be exhausted to the outside through a gas exhaust 60 that is disposed in an inner portion of a center axis 14 of the susceptor 11.

Meanwhile, the reactive gas supplier 30 may be disposed along the chamber cover 20 and a central axis part of the chamber body 10, and have a radial structure such that the reactive gas G flows to have a gas flow directed from a center of the chamber body 10 to the periphery thereof as shown in FIGS. 15 and 16.

Described in detail, as shown in FIG. 15, a reactive gas supplier 30' according to another embodiment of the present invention may include a reactive gas introduction passage 33 and a reactive gas nozzle 32. The reactive gas introduction passage 33 may penetrate a center of the chamber cover 20 to introduce the reactive gas G from the outside. The reactive gas nozzle 32 may release the reactive gas G introduced through the reactive gas introduction passage 33 into the reaction space 15, the reactive gas G flowing to form a radial gas flow directed from a center of the chamber cover 20 to the periphery thereof. Herein, the reactive gas introduction passage 33 may be extended from the chamber cover 20 toward the susceptor 11 by a predetermined length, such that the released reactive gas G flows across a surface of the susceptor 11.

FIG. 15 illustrates a single reactive gas introduction passage 33, but the present invention is not limited thereto, and a plurality of reactive gas introduction passages may be used. In this case, gases may be released into the reaction space 15 to be distinguished according to respective reactive gases. The reactive gas G supplied through the reactive gas introduction passage 33 may be radially released from the central part of the susceptor 11 to the peripheral part thereof through the reactive gas nozzles 32. Then, the reactive gas G may be exhausted to the outside through the gas exhaust part 60' disposed adjacently to and along a circumferential surface of the susceptor 11.

The non-reactive gas supplier 40 may supply the non-reactive gas (g) to the reaction space 15 such that the non-reactive gas (g) flows across the surface of the chamber cover 20 in a direction in which the reactive gas G flows between the susceptor 11 and the chamber cover 20, thereby preventing the reactive gas G from contacting the surface of the chamber cover 20. That is, a deposition material (dummy coating) may be prevented from being attached by a parasitic deposition to a lower surface of the chamber cover 20 that is provided as a ceiling of the chamber body 10, by the reactive gas G flowing in the reaction space 15. The non-reactive gas (g) may be a non-reactive gas such as H2, N2 or the like.

As shown in the drawings, the non-reactive gas supplier 40 may include a non-reactive gas storage chamber 43 and a plurality of non-reactive gas nozzles 41. The non-reactive gas storage chamber 43 may be disposed within the chamber cover 20 and receive the non-reactive gas (g) introduced from the outside. The plurality of non-reactive gas nozzles 41 may be disposed in a radial manner based on the center of the chamber cover 20 and may communicate with the non-reactive gas storage chamber 43 to release the non-reactive gas (g) into the reaction space 15. Here, the non-reactive gas nozzles 41 may have a slit structure rather than a circular shape. The non-reactive gas nozzles 41 may be connected with the non-reactive gas storage chamber 43 through the non-reactive gas introduction passage 42.

The non-reactive gas storage chamber 43 may be a space having a predetermined size within the chamber cover 20, and may receive the non-reactive gas (g) from the outside through a pipe 22 that penetrates the chamber cover 20. The non-reactive gas storage chamber 43 may have a single structure, or may be provided such that a plurality of non-reactive gas storage chambers 43 may be disposed to have a circular-ring shape in the form of concentric circles in an overlapping structure, to correspond to the non-reactive gas nozzles 41 that are radially formed as shown in FIG. 16.

As shown in FIG. 17, in the case of the non-reactive gas nozzle 41, a plurality of non-reactive gas nozzles 41 may be arrayed to be spaced apart from one another at predetermined intervals, along the circumferences of a plurality of concentric circles having different radii based on the center of the chamber cover 20, and the non-reactive gas nozzles 41 formed along the circumference of each concentric circle may be provided to have a shape corresponding to an arc shape of a corresponding concentric circle. FIG. 17 shows four respective non-reactive gas nozzles 41 and 41' formed along the circumference of each concentric circle, but the non-reactive gas nozzles 41 and 41' are not limited thereto, and the number of non-reactive gas nozzles 41 and 41' may vary.

In particular, in the case of the non-reactive gas nozzles 41, a plurality of non-reactive gas nozzles formed along the circumference of a circle of each concentric center, and a plurality of other non-reactive gas nozzles 41' formed along the circumference of a circle of an adjacent concentric circle, may be disposed to alternate with each other. In detail, a plurality of virtual concentric circles (9 in the drawing) may be formed with constant intervals therebetween based on a center of the chamber cover 20, and then, a plurality of non-reactive gas nozzles 41 and 41' (4 in the drawing) may be disposed with constant intervals therebetween on each concentric circle. A non-reactive gas nozzle 41 formed on each odd-numbered concentric circle centered on a center of the chamber cover 20 and a non-reactive gas nozzle 41' formed on its adjacent even-numbered concentric circle may be alternately disposed so as not to be overlapped with each other. Therefore, the non-reactive gas nozzles 41' disposed on the even-numbered concentric circles may be disposed between the respective non-reactive gas nozzles 41 disposed on the odd-numbered concentric circles. Herein, a distance (d) between non-reactive gas nozzles (41-1, 41-3, 41-5, 41-7 and 41-9) provided on the odd-numbered concentric circles (for example, a distance between the non-reactive gas nozzle 41-1 on a first concentric circle and a non-reactive gas nozzle 41-3 on a third concentric circle) may be equal to a distance (d) between non-reactive gas nozzles (41'-2, 41'-4, 41'-6 and 41'-8) provided on the even-numbered concentric circles (for example, a distance between the non-reactive gas nozzle 41'-2 on the second concentric center and the non-reactive gas nozzle 41'-4 on the fourth concentric circle). The distance (d) may be between 20 mm and 50 mm. When the distance (d) is shorter than 20 mm, it is not easy to form the non-reactive gas nozzles 41 because of a relatively narrow interval between the non-reactive gas nozzles 41, and furthermore, a released amount of the non-reactive gas (g) may be excessively increased. When the distance (d) is more than 50 mm, a function of preventing a deposition material from being attached to the chamber cover 20 may be weakened due to a diffused non-reactive gas (g). Therefore, it may be appreciated that a region able to have a remarkable effect in preventing deposition material attachment by the non-reactive gas (g) is between 20 mm~50 mm as the distance d between the non-reactive gas nozzles.

Meanwhile, the non-reactive gas nozzle 41 may be bent from the non-reactive gas introduction passage 42 in a flow direction of the reactive gas G to correspond to the flow direction of the reactive gas G supplied through the reactive gas supplier 30. In detail, as shown in FIGS. 11 to 14, when the reactive gas supplier 30 is disposed around the side surface of the chamber body 10 to allow the reactive gas G to flow in an inverse-radial direction, the non-reactive gas nozzle 41 may also be bent toward a center of the chamber cover 20 so as to correspond to a flow direction of the reactive gas G. In addition, as shown in FIGS. 15 and 16, when the reactive gas supplier 30' is disposed along a central part of the chamber body 10 to allow the reactive gas G to flow in a radial direction, the non-reactive gas nozzle 41 may be also formed to be bent toward an outer circumference of the chamber cover 20 so as to correspond to a flow direction of the reactive gas. As such, as the non-reactive gas nozzle 41 is bent to correspond to a flow direction of the reactive gas G, the reactive gas G may be maintained to have a stable laminar flow by the non-reactive gas (g) without being affected by any interference, thereby effectively preventing the reactive gas G from contacting the chamber cover 20.

As described above, the plurality of step parts 21 may be radially formed on a lower surface of the chamber cover 20 exposed to the reaction space 15, so as to have the form of centric circles centered on the center of the chamber cover 20. A concentric circle formed by the non-reactive gas nozzles 41 may be formed at a position corresponding to a concentric circle formed by the step parts 21. Therefore, the non-reactive gas nozzles 41 may communicate with the reaction space 15 through the step part 21 of the chamber cover 20. In detail, as shown in FIG. 12, the step part 21 may be formed to include a vertical part 21-1 to which the non-reactive gas nozzles 41 is exposed to release the non-reactive gas (g) into the reaction space 15, and a slope surface 21-2 formed to slope downwardly toward a vertical part 21-1 of an adjacent other step part 21 so as to track a flow direction of the reactive gas G. In addition, as shown in FIG. 14, a step part 21' may include a vertical part 21'-1 to which the non-reactive gas nozzle 41 is exposed to release the non-reactive gas (g) into the reaction space 15, and a plane surface 21'-2 extended to the vertical part 21'-1 of an adjacent other step part 21' so as to track a flow direction of the reactive gas G.

As shown in FIGS. 11 and 13, a gas exhaust part 60 may be disposed within a center axis 14 of the susceptor 11, and at an upper part that is opposed to the gas exhaust part 60, the cover member 50 may be disposed in the structure in which the reactive gas has an inverse-radial gas flow, thereby preventing a deposition material from being attached to the surface of the chamber cover due to parasitic deposition. In detail, the cover member 50 may have a diameter corresponding to a distance between pocket parts 12 formed at both sides of the gas exhaust part 60, such that the cover member 50 covers a surface of the chamber cover that is not covered by the non-reactive gas (g) released from the non-reactive gas nozzle 41 disposed at a center part. The cover member 50 may be formed of a quartz material and disposed above the susceptor 11 through a support part 51.

Figure 18:
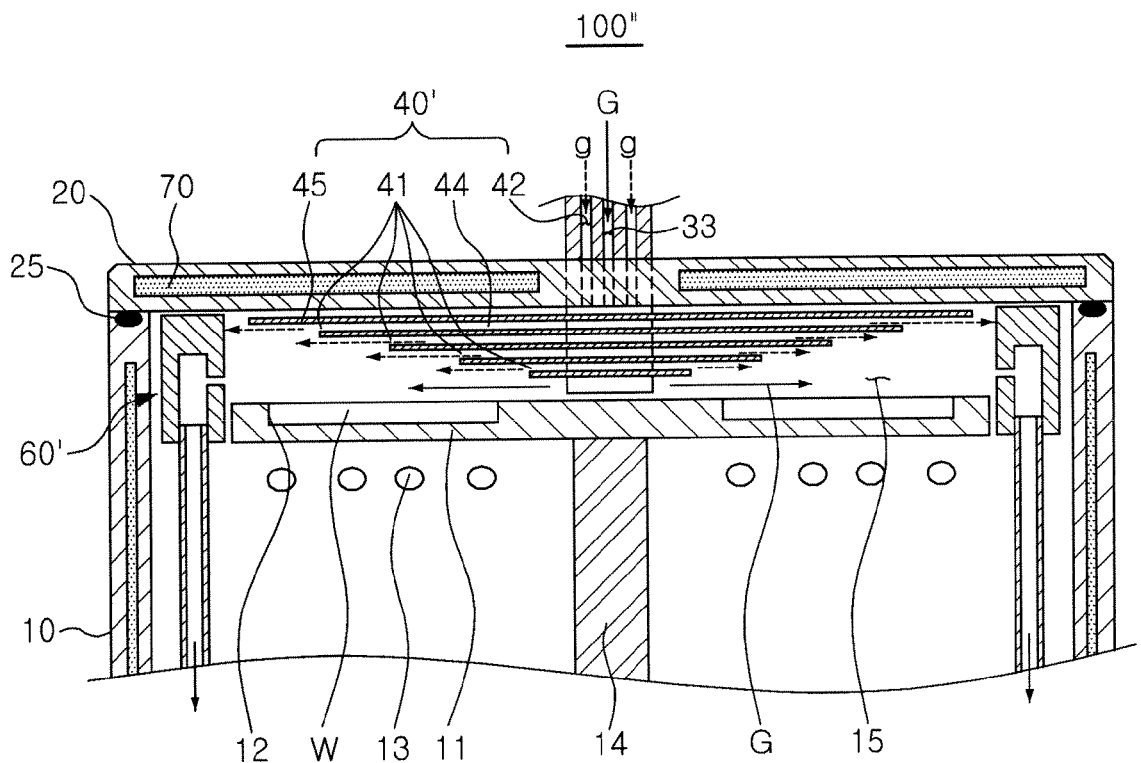
FIG. 18 is a cross-sectional view of a CVD apparatus according to another embodiment of the present application.
Figure 19:
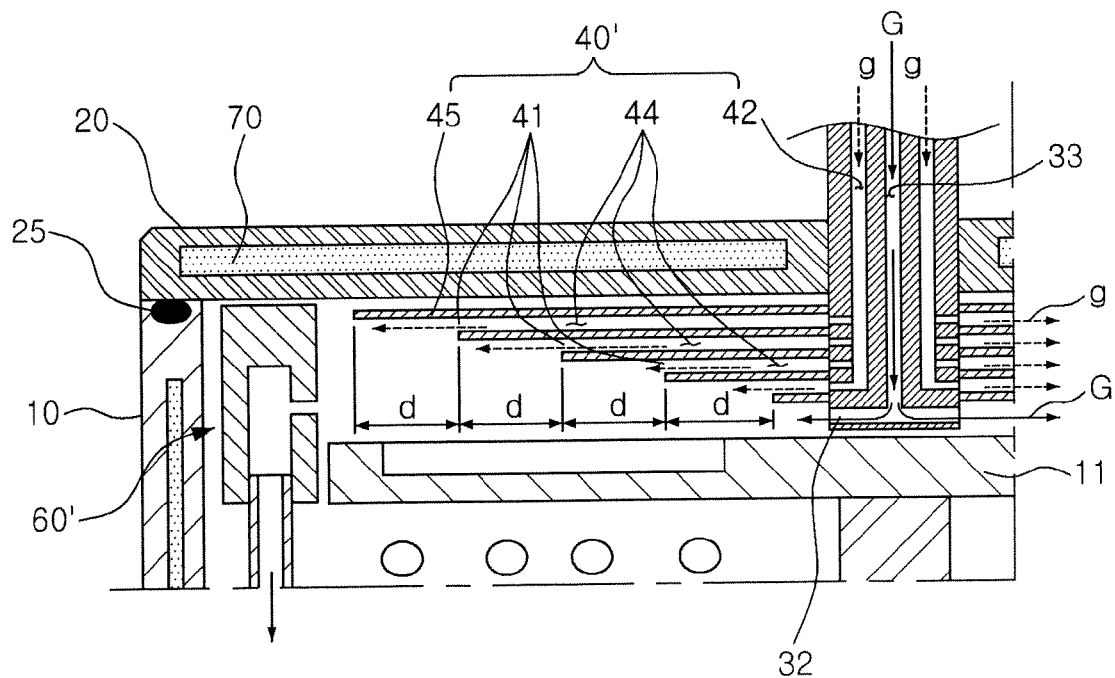
FIG. 19 is a schematic cross-sectional view showing a gas flow through a reactive gas supplier and a non-reactive gas supplier shown in FIG. 18.

Referring to FIGS. 18 and 19, a CVD apparatus according to another embodiment of the present invention will be described. FIG. 18 is a cross-sectional view of a CVD apparatus according to another embodiment of the present invention. FIG. 19 is a cross-sectional view illustrating a flow of gas through a reactive gas supplier and a non-reactive gas supplier shown in FIG. 18.

With reference to FIGS. 18 and 19, a CVD apparatus 100" according to another embodiment of the present invention may include a chamber body 10, a chamber cover 20, a reactive gas supplier 30, a non-reactive gas supplier 40' and a cover member 50.

The CVD apparatus according to the embodiment illustrated in FIGS. 18 and 19 may have a configuration substantially equal to that of the embodiment of FIGS. 15 and 16. Merely, since the non-reactive gas supplier structure differs from that of the embodiment illustrated in FIGS. 15 and 16, the description of the same or like parts will be omitted, based on the description of the non-reactive gas supplier below.

As shown in the drawings, the non-reactive gas supplier 40' may include a non-reactive gas introduction passage 42 formed to penetrate the center of the chamber cover 20 and extended toward the susceptor 11; a plurality of non-reactive gas nozzles 41 formed along a circumference of the non-reactive gas introduction passage 42 to radially release the non-reactive gas (g); a connection part 44 connecting the non-reactive gas introduction passage 42 with the non-reactive gas nozzle 41.

The connection part 44 may include a plurality of plate members 45. The plurality of plate members 45 may be insertedly fixed to the non-reactive gas introduction passage 42 extended to the reaction space 15, and may be disposed to be spaced apart from each other vertically within a multi-layered structure provided in a lengthwise direction of the non-reactive gas introduction passage 42. Particularly, the plurality of plate members 45 may be disposed concentrically to have a plurality of concentric circles having different radii based on the center of the non-reactive gas introduction passage 42, and may have a step structure in which the sizes of radii thereof are reduced from the chamber cover 20 toward the susceptor 11.

In this case, the difference in the radii between the plate members 45 adjacent to each other may be a difference corresponding to a distance (d) between the non-reactive gas nozzles 41 as described above with respect to the embodiments of FIGS. 11 to 17. The plate member 45 may be formed of a material that is not easily thermally transformed, for example, quartz or the like. The present embodiment describes the case in which the plate members 45 configuring the connection part 44 are insertedly fixed to the non-reactive gas introduction passage 42, to be provided as a separate configuration, but are not limited thereto. The plate members 45 may also have a structure in which they are extended from an edge surface of the non-reactive gas introduction passage 42 so as to be formed as one body. The non-reactive gas nozzles 41 may be respectively connected to the non-reactive gas introduction passages 42 through the connection parts 44 disposed within a multi-layered structure, such that the non-reactive gas (g) introduced through the non-reactive gas introduction passages 42 is released into the reaction space 15. In particular, since the plate members 45 of the connection parts 44 disposed within the multi-layered structure have a step structure in which radii thereof are gradually increased from the susceptor 11 side, that is, a lower part thereof, toward the chamber cover 20 side, that is, an upper part thereof; the reactive gas nozzles 41 respectively provided with a distal end of the plate members 45 respectively configuring the connection parts 44 may have increased distances from the non-reactive gas introduction passage 42, that is, from a lower part to an upper part, so as to correspond to the above increased radii. Therefore, even in the case of a significant distance existing from the center of the susceptor to an outer circumference thereof, since the non-reactive gas may be released, a deposition adhesion preventing effect may be prevented from being reduced.

The reactive gas supplier 30 may include a reactive gas introduction passage 33 and a reactive gas nozzle 32. The reactive gas introduction passage 33 may be disposed within the non-reactive gas introduction passage 42 of the non-reactive gas supplier 40 to introduce a reactive gas G from the outside. The reactive gas nozzle 32 may be disposed at an end part of the reactive gas introduction passage 33 to release the reactive gas G to have a radial gas flow directed from the center of the susceptor 11 to an outer circumference thereof. As shown in the drawing, the reactive gas nozzle 32 may be disposed at a lowermost portion of the non-reactive gas introduction passage 42 to be near to the susceptor 11 so as to allow the reactive gas to flow across a surface of the susceptor 11.

The non-reactive gas supplier 40 may penetrate the chamber cover 20, whereby the refrigerant storage chamber 70 may be formed within the chamber cover 20 to refrigerate the cover member 50 and the chamber cover 20.

Figure 20:
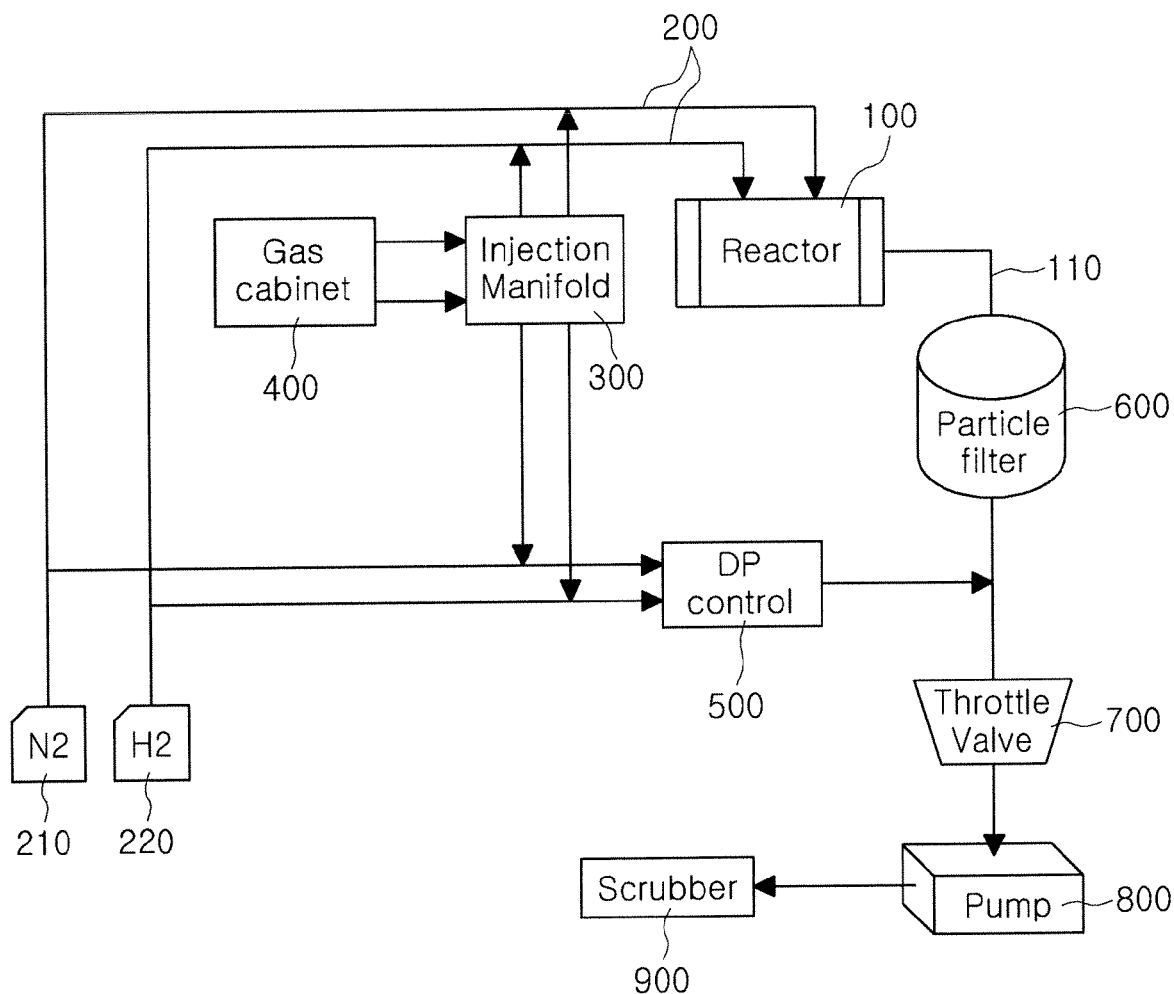
FIG. 20 schematically shows a system using the CVD apparatus according to the embodiment of the present invention.
Figure 21:
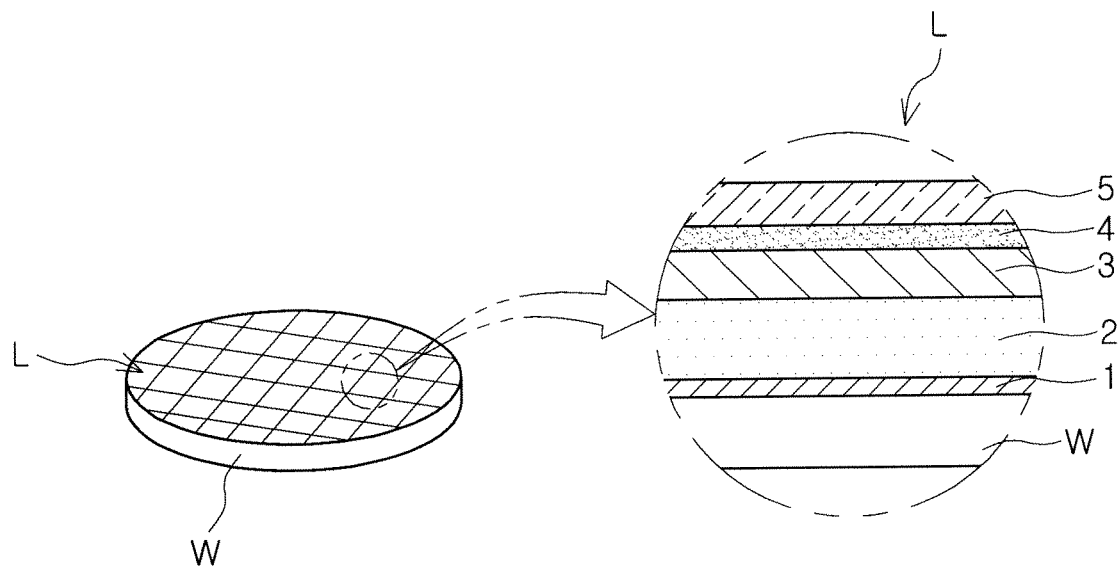
FIG. 21 schematically represents the structure of a thin film grown on a wafer by using the system of FIG. 20.
Figure 22:
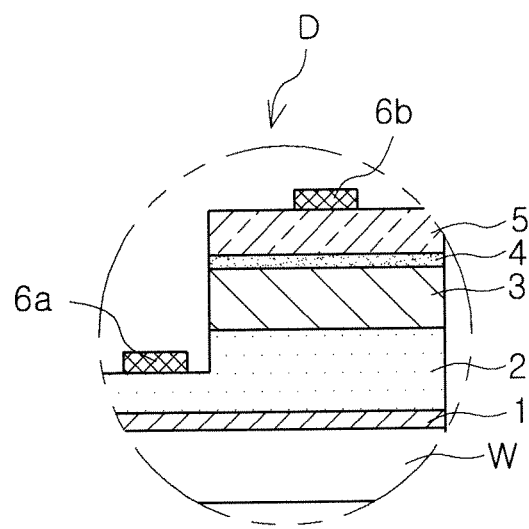
FIG. 22 is a schematic cross-sectional view showing a state in which an electrode is formed on the thin film shown in FIG. 21.

Meanwhile, with reference to FIGS. 20 to 22, a method of manufacturing a light emitting device by using a CVD apparatus shown in FIGS. 1 to 19 will be described. FIG. 20 schematically shows a system using the CVD apparatus, FIG. 21 schematically represents the structure of a thin film grown on a wafer by using the system of FIG. 20, and FIG. 22 is a cross-sectional view schematically showing a state in which an electrode is formed on the thin film shown in FIG. 21.

As shown in FIG. 20, the CVD apparatus 100 may be connected with a reactive gas cabinet 400 and non-reactive gas cabinets 210 and 220 through respective conduits 200 to receive a reactive gas and a non-reactive gas. A flow of the reactive gas and the non-reactive gas into the CVD apparatus 100 may be controlled by injection manifolds 300. The reactive gas cabinet 400 and the non-reactive gas cabinets 210 and 220 may be connected to an exhaust line 110 of the CVD apparatus 100, and a flow of the reactive gas and the non-reactive gas partially discharged to the outside through a differential pressure control 500 may be controlled thereby. The CVD apparatus 100 may discharge the reactive gas and the non-reactive gas to the outside through the exhaust line 110 after a deposition process. The discharged reactive gas and the non-reactive gas may be exhausted to a scrubber 900 through a filter 600. A non-described reference numeral 700 refers to a throttle valve, while reference numeral 800 refers to a pump.

Hereinafter, a method of manufacturing a light emitting device by using the CVD apparatus included in the system described above will be described. The light emitting device may include a light emitting diode (LED) die formed of thin films grown using the CVD apparatus.

First, in the CVD apparatus 100 including the chamber body 10 and the chamber cover 20 as describe above with reference to FIGS. 1 to 19, a wafer W for thin film growth may be mounted (loaded) on each pocket part 12 provided on the susceptor 11 within the chamber body 10. The wafer W may include sapphire, potassium nitride, aluminum nitride, silicon carbide (SiC), silicon, Ga2O3, ZnO, and the like. A sapphire having c-crystal plane/r-crystal plane/m-crystal plane or the like may be used. The wafer W may be 2 inches, 4 inches, 6 inches, 8 inches, 12 inches, or the like, according to the size of the pocket part 12 provided on the susceptor 11. In the case of a 2 inch wafer, the susceptor 11 may receive about 30 to 140 pieces of wafer W mounted therein at a time. In the case of a 4 inch wafer, the susceptor 11 may receive about 8 to 40 pieces of wafer W mounted therein at a time. In the case of a 6 inch wafer, the susceptor 11 may receive about 5 to 20 pieces of wafer W mounted therein at a time. In the case of a 12 inch wafer, the susceptor 11 may receive about 1 to 4 pieces of wafer W mounted therein at a time. The pocket part 12 of the susceptor 11 may be formed to have a slipped surface on which the wafer W is mounted or to have one or several grooves (not shown) formed in both end portions or in the middle portion thereof. The groove or grooves may allow form uniform thermal distribution at the time of heating at relatively high temperature such that the wafer W may be prevented from being bent due to a bowing effect.

After the wafer W is mounted (loaded) on the susceptor 11, the chamber body 10 may be closed by the chamber cover 20 to maintain a sealing state thereof. The sealing to the chamber body 10 inside may be maintained in vacuum having a level of approximately 10-9~10-10 torr by using a vacuum pump or the like. As the vacuum pump, a dry pump, a scroll pump, a rotary pump or the like may be used. Although the use thereof may be different, the dry pump may be generally used in a case in which a gas exhaust speed is relatively rapid and relatively high-level vacuum is required.

Subsequently, the non-reactive gas (g) received in the non-reactive gas storage chamber 21 provided within the chamber cover 20 may be released into the reaction space 15 formed between the cover member 50 and the susceptor 11 through the non-reactive gas supplier 40 provided with the cover member 50 mounted in the chamber cover 20. The non-reactive gas (g) may be nitrogen, hydrogen, helium, or the like. The reactive gas G may be released into the reaction space 15 through the reactive gas supplier 30 disposed within the chamber body 10 so as to grow a thin film on a surface of the wafer W. In detail, in operation of releasing the reactive gas G, the reactive gas G may be supplied into the reaction space 15 such that the reactive gas flows across a surface of the susceptor 11, and in operation of releasing the non-reactive gas (g), the non-reactive gas may be supplied into the reaction space 15 such that the non-reactive gas flows across a surface of the cover member 50, thereby preventing the reactive gas G flowing in a lower part from contacting the surface of the cover member 50 provided as an upper part thereof. Herein, in order to maintain a smooth flow of the reactive gas G and the non-reactive gas (g), the non-reactive gas (g) may be supplied to follow a flow of the reactive gas G, so as to correspond to a flow direction of the reactive gas G supplied through the reactive gas supplier 30. Further, the releasing of the non-reactive gas (g) may be performed prior to or simultaneously with the releasing of the reactive gas G. A GaN semiconductor thin film formation on a 4 inch sapphire wafer W is mainly described in detail. For a thin film growth process on the wafer W, a temperature of the wafer W on the susceptor 11 may be adjusted to become 500 to 1300 degrees Celsius by using the heating unit 13. Further, reactive gas G, such as TMGa, TEGa, NH3, TMIn, TMAl, Cp2Mg, SiH4, DTBSi or CBr4, may be supplied to the wafer W of the reaction space 15, and non-reactive gas (g) of N2 and H2 may be supplied across the surface of the cover member 50. Whereby, the thin film growth process may be performed on the wafer W.

Next, when the thin film growth is completed on the wafer W, the growth-completed wafer W may be naturally cooled until temperature thereof becomes approximately 100 degrees Celsius, and thereafter, the wafer W on which the thin film growth has been completed may be taken out of (unloaded) the chamber body 10 by opening the chamber body 10 and may be substituted with a new wafer to have a thin film epitaxial layer deposited thereon.

The growth-completed thin film L, that is, a semiconductor layer, may include a buffer layer 1, an n-GaN layer 2, a light emitting layer 3, an electron-blocking layer (EBL) 4 and a p-GaN layer 5, sequentially laminated on the sapphire wafer W as shown in FIG. 21. The buffer layer 1 may be employed as an undoped semiconductor layer formed of nitride and the like, and in order to alleviate a lattice defect of the GaN layer that is a semiconductor layer grown thereon, the buffer layer 1 may be formed on the wafer W at a relatively low temperature (500 to 600 degrees Celsius) before the growth of the GaN layer. The n-GaN layer 2 may be formed by doping GaN with Si in order to form a negative electrode, and the p-GaN layer 5 may be formed by doping GaN with Mg in order to form a positive electrode. The light emitting layer 3 may be formed between the n-GaN layer 2 and the p-GaN layer 5 and may emit light having predetermined energy by the recombination of electrons and holes. The light emitting layer 3 may be formed to have a multi-quantum well (MQW) structure in which a quantum well layer and a quantum barrier layer are alternately laminated, for example, an InGaN/GaN structure. The electron blocking layer 4 may be formed between the light emitting layer 3 and the p-GaN layer 5 to block electrons that have passed through the light emitting layer 3.

Since the electron blocking layer 4 may be disposed on the light emitting layer 3 to block a flow of electrons passing from the n-GaN layer 2 to the light emitting layer 3, electron and hole recombination efficiency in the light emitting layer 3 may be increased. The electron blocking layer 4 may have an ultra-lattice structure in which AlGaN, GaN and InGaN are alternately laminated, and AlGaN, GaN and InGaN forming the electron blocking layer 4 may have different thicknesses. For example, the electron blocking layer 4 may be formed to have a structure in which AlGan/GaN/InGaN are repeatedly laminated, and a thickness of an AlGaN layer may be reduced from the light emitting layer 3 toward the p-GaN layer 5. Further, the thickness of a GaN layer and an InGaN layer may be increased from the light emitting layer 3 toward the p-GaN layer 5. In this case, since AlGaN has relatively high band gap energy, electrons injected into the light emitting layer 3 from the n-GaN layer 2 may be prevented from overflowing to the p-GaN layer 5 after passing the light emitting layer 3, and simultaneously, since the thickness thereof is reduced toward the p-GaN layer 5, injection efficiency of holes into the light emitting layer 3 may not be deteriorated. In addition, since the GaN layer and the InGaN layer have band-gap energy less than the AlGaN layer, electrons may overflow to the p-GaN layer 5 after passing the light emitting layer 3, but since the thickness thereof may be increased toward to the p-GaN layer 5, the overflow of electrons may be effectively prevented.

Subsequently, these wafers W completed in the thin film growth process are then singulated into individual dies D through a dicing process or the like, after undergoing an etching process, an electrode forming process, a polishing process, and the like, as shown in FIG. 22. Further, each die D may be completed as a product through a packaging process.

Figure 23:
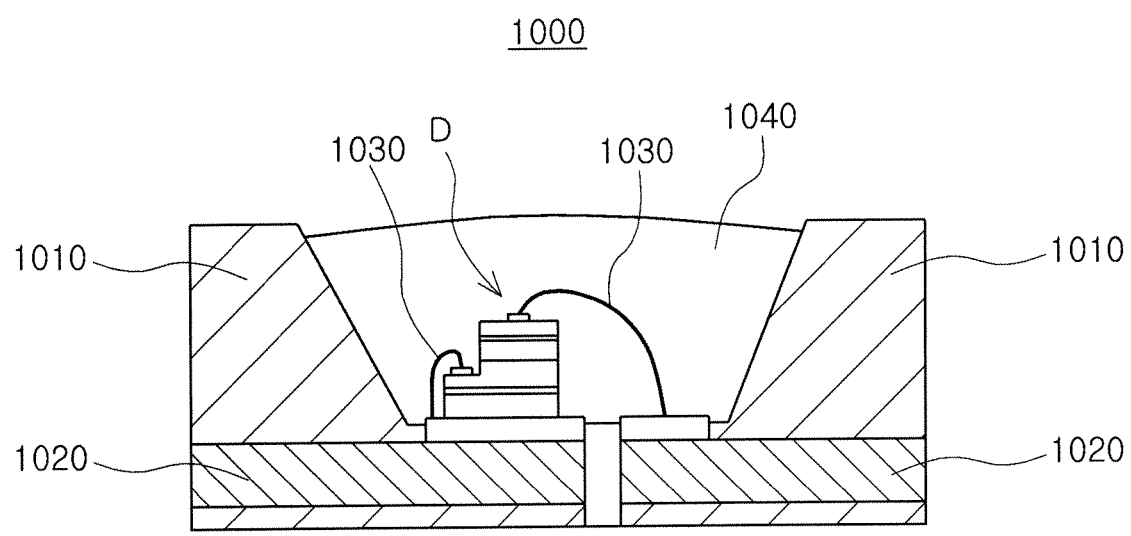
FIG. 23 is a schematic cross-sectional view of a light emitting device package using a light emitting device manufactured according to an embodiment of the present invention.

That is, as shown in FIG. 23, the die D may be mounted on a lead frame 1020 of a package body 1010, and respective electrodes 6a and 6b formed through the electrode forming process may be electrically connected to the lead frame 1020 by using a wire 1030. In addition, the die D may be molded by a molding member 1040 formed of a resin including a transparent resin or phosphor, whereby an individual light emitting device package 1000 may be completed.

An LED package 1000 completed through a series of processes described above may be variously used as a light source in the field of displays, such as TV BLUs, monitors, notebook computers, mobile phone products, and the like, in the field of indoor and outdoor LED lighting devices, and in the field of vehicle lighting applications, such as headlamps, turn indicator lamps, instrument panels, vehicle courtesy lights, and the like.

While the present invention has been shown and described in connection with the exemplary embodiments, it will be apparent to those skilled in the art that modifications and variations can be made without departing from the spirit and scope of the invention as defined by the appended claims.

The invention claimed is:

1. A chemical vapor deposition (CVD) apparatus, comprising:
 a chamber body including a susceptor having at least one pocket part formed therein, the pocket part having a wafer stably mounted therein;
 a chamber cover provided with the chamber body to open or close the chamber body, having a surface exposed to the chamber body, and forming a reaction space between the susceptor and the chamber cover;
 a reactive gas supplier supplying the reactive gas to the reaction space to allow the reactive gas to flow across a surface of the susceptor; and
 a non-reactive gas supplier supplying a non-reactive gas to the reaction space and disposed relative to the reactive gas supplier to cause the non-reactive gas to flow along the surface of the chamber cover substantially parallel to the surface of the chamber cover between the susceptor and the chamber cover so as to prevent the reactive gas supplied by the reactive gas supplier from contacting the surface of the chamber cover,
 wherein the chamber cover includes a plurality of step parts formed concentrically and radially with regard to the center of the chamber cover, in a lower surface thereof exposed to the reaction chamber.

2. The CVD apparatus of claim 1, wherein the non-reactive gas supplier includes a non-reactive gas introduction passage provided with the chamber cover to introduce the non-reactive gas from the outside, and non-reactive gas nozzles releasing the introduced non-reactive gas into the reaction space.

3. The CVD apparatus of claim 2, wherein a plurality of the non-reactive gas nozzles are distributedly disposed on a lower surface of the chamber cover exposed to the reaction space.

4. The CVD apparatus of claim 2, wherein the chamber cover includes a cover member facing the susceptor in a lower part thereof and exposed to the reaction space.

5. The CVD apparatus of claim 4, wherein the cover member is detachable from the chamber cover.

6. The CVD apparatus of claim 4, wherein the plurality of non-reactive gas nozzles are distributedly disposed on the cover member exposed to the reaction chamber.

7. The CVD apparatus of claim 4, wherein the non-reactive gas introduction passage is extended to the susceptor while penetrating the cover member, and the non-reactive gas nozzles are formed along a circumferential surface of the non-reactive gas introduction passage exposed to an inner portion of the reaction space to radially release the non-reactive gas.

8. The CVD apparatus of claim 2, wherein the non-reactive gas nozzles are tilted in a flow direction of the reactive gas so as to correspond to the flow direction of the reactive gas supplied through the reactive gas supplier.

9. The CVD apparatus of claim 2, wherein the non-reactive gas supplier further includes a non-reactive gas storage chamber provided in the chamber cover.

10. The CVD apparatus of claim 9, wherein the non-reactive gas nozzles communicate with the non-reactive gas storage chamber through the non-reactive gas introduction passage, and release the non-reactive gas received in the non-reactive gas storage chamber to the reaction space.

11. The CVD apparatus of claim 1, further comprising:
 a gas exhaust exhausting the reactive gas and the non-reactive gas from the reaction space,
 wherein the reactive gas supplier is disposed between the non-reactive gas supplier and the gas exhaust to allow the reactive gas to flow from the reactive gas supplier to the gas exhaust without interfering with the flow of non-reactive gas from the non-reactive gas supplier along the surface of the chamber cover to the gas exhaust.

12. The CVD apparatus of claim 1, further comprising:
 a gas exhaust exhausting the reactive gas and the non-reactive gas from the reaction space,
 wherein the reactive gas supplier is disposed between the chamber cover and the gas exhaust to allow the reactive gas to flow from the reactive gas supplier across a surface of the wafer mounted in the susceptor to the gas exhaust without contacting the surface of the chamber cover.

13. The CVD apparatus of claim 1, wherein the reactive gas supplier contacts the chamber body and the non-reactive gas supplier contacts the chamber cover.

14. The CVD apparatus of claim 1, wherein the chamber cover is spaced apart from the susceptor in one direction, and the non-reactive gas supplier supplies the non-reactive gas through a plurality of nozzles that are disposed further from the susceptor in the one direction than nozzles of the reactive gas supplier.

15. A chemical vapor deposition (CVD) apparatus, comprising:
 a chamber body including a susceptor having at least one pocket part formed therein, the pocket part having a wafer stably mounted therein;
 a chamber cover provided with the chamber body to open or close the chamber body and forming a reaction space between the susceptor and the chamber cover;
 a reactive gas supplier supplying the reactive gas to the reaction space to allow the reactive gas to flow across a surface of the susceptor; and
 a non-reactive gas supplier supplying a non-reactive gas to the reaction space to allow the non-reactive gas to flow across a surface of the chamber cover between the susceptor and the chamber cover so as to prevent the reactive gas from contacting the surface of the chamber cover,
 wherein the non-reactive gas supplier includes a plurality of non-reactive gas nozzles that are disposed concentrically such that they are spaced apart from each other along a plurality of concentric circles having different sizes based on the center of the chamber cover, the non-reactive gas nozzles provided along a circumference of each concentric circle being formed to have an arc shape of a corresponding concentric circle.

16. The CVD apparatus of claim 15, wherein the non-reactive gas nozzles are disposed such that the plurality of non-reactive gas nozzles provided along the circumference of each concentric circle are alternated with other plurality of non-reactive gas nozzles provided along circumferences of concentric circles adjacent thereto.

* * * * *